United States Patent
Hasebe et al.

(10) Patent No.: US 7,537,943 B2
(45) Date of Patent: May 26, 2009

(54) METHOD OF MANUFACTURING A SEMICONDUCTOR INTEGRATED CIRCUIT DEVICE

(75) Inventors: Akio Hasebe, Tokyo (JP); Yasuhiro Motoyama, Tokyo (JP); Yasunori Narizuka, Tokyo (JP); Seigo Nakamura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 51 days.

(21) Appl. No.: 11/866,301

(22) Filed: Oct. 2, 2007

(65) Prior Publication Data

US 2008/0096295 A1    Apr. 24, 2008

(30) Foreign Application Priority Data

Oct. 24, 2006   (JP)   .............................. 2006-288642

(51) Int. Cl.
  *H01L 21/66*   (2006.01)
  *G01R 31/26*   (2006.01)
(52) U.S. Cl. ........................... 438/17; 438/14; 438/107; 438/592; 438/742; 438/754; 324/537; 324/754; 324/756; 324/757; 324/765; 257/E21.531
(58) Field of Classification Search ........... 257/E21.531
See application file for complete search history.

(56) References Cited

U.S. PATENT DOCUMENTS

| | | | |
|---|---|---|---|
| 6,305,230 B1 | 10/2001 | Kasukabe et al. | |
| 6,506,627 B1 * | 1/2003 | Murakamz et al. | .......... 438/118 |
| 7,049,837 B2 | 5/2006 | Kasukabe et al. | |
| 7,219,422 B2 | 5/2007 | Wada et al. | |
| 7,235,413 B2 | 6/2007 | Hasebe et al. | |
| 2005/0093565 A1 | 5/2005 | Okamoto et al. | |
| 2006/0094162 A1 | 5/2006 | Yabushita et al. | |
| 2006/0192575 A1 | 8/2006 | Kasukabe et al. | |

FOREIGN PATENT DOCUMENTS

| | | | |
|---|---|---|---|
| JP | 7-283280 A | 10/1995 |
| JP | 8-50146 A | 2/1996 |
| JP | 8-201427 A | 8/1996 |
| JP | 10-308423 A | 11/1998 |
| JP | 11-23615 A | 1/1999 |
| JP | 11-97471 A | 9/1999 |
| JP | 2000-150594 A | 5/2000 |
| JP | 2001-159643 A | 6/2001 |
| JP | 2004-132699 A | 4/2004 |
| JP | 2004-144742 A | 5/2004 |
| JP | 2004-288672 A | 10/2004 |
| JP | 2005-24377 A | 1/2005 |
| JP | 2005-136246 A | 5/2005 |
| JP | 2005-136302 A | 5/2005 |
| JP | 2006-118945 A | 5/2006 |

\* cited by examiner

*Primary Examiner*—Alexander G Ghyka
*Assistant Examiner*—Mohsen Ahmadi
(74) *Attorney, Agent, or Firm*—Miles & Stockbridge P.C.

(57) ABSTRACT

A technique of manufacturing a semiconductor integrated circuit device is provided for reducing the possibility of attachment of foreign matter to a membrane probe when performing probe inspection using the membrane probe formed by the manufacturing technique. A pressing member for pressing a membrane sheet includes a pressing pin receiving portion relatively disposed above for receiving the tip of a pressing pin of the plunger in a recess, and a membrane sheet pressing portion relatively disposed below. The membrane sheet pressing portion in contact with the membrane sheet has the minimum plane size to enable pressing of the entire surface of one chip of interest to be subjected to the probe inspection.

9 Claims, 21 Drawing Sheets

METHOD OF MANUFACTURING A SEMICONDUCTOR INTEGRATED CIRCUIT DEVICE

CROSS-REFERENCE TO RELATED APPLICATIONS

The disclosure of Japanese Patent Application No. 2006-288642 filed on Oct. 24, 2006 including the specification, drawings and abstract is incorporated herein by reference in its entirety.

BACKGROUND OF THE INVENTION

The present invention relates to a manufacturing technique of a semiconductor integrated circuit device, and more particularly, to a technique that is effectively applied to electric inspection of a semiconductor integrated circuit by pressing probes of a probe card against electrode pads of the semiconductor integrated circuit device.

Japanese Unexamined Patent Publication No. 2005-24377 (Patent Document 1) and Japanese Unexamined Patent Publication No. 2004-144742 (Patent Document 2) disclose a prober structure including probe needles, an insulating film, and wiring for deriving which are formed using a manufacturing technique of a semiconductor integrated circuit device, a pushing block, and a spring probe. A conical groove to engage with a protrusion of the spring probe is provided in the center of an upper surface of the pressing block.

Japanese Unexamined Patent Publication No. 2006-118945 (Patent Document 3) discloses a prober structure including contact terminals, an insulating film, and wiring for deriving which are formed using a manufacturing technique of a semiconductor integrated circuit device, wherein a clearance is formed between the contact terminals for allowing the contact terminals to be located higher.

Japanese Unexamined Patent Publication No. Hei 7(1995)-283280 (Patent Document 4), Japanese Unexamined Patent Publication No. Hei 8(1996)-50146 (Patent Document 5 (corresponding to PCT International Patent WO 95-34000)), Japanese Unexamined Patent Publication No. Hei 8(1996)-201427 (Patent Document 6), Japanese Unexamined Patent Publication No. Hei 10(1998)-308423 (Patent Document 7), Japanese Unexamined Patent Publication No. Hei 11(1999)-23615 (Patent Document 8 (corresponding to U.S. Pat. No. 6,305,230, Japanese Unexamined Patent Publication No. Hei 11(1999)-97471 (Patent Document 9 (corresponding to Europe Patent EP No. 1022775)), Japanese Unexamined Patent Publication No. 2000-150594 (Patent Document 10 (corresponding to Europe Patent EP No. 0999451)), Japanese Unexamined Patent Publication No. 2001-159643 (Patent Document 11), Japanese Unexamined Patent Publication No. 2004-144742 (Patent Document 2), Japanese Unexamined Patent Publication No. 2004-132699 (Patent Document 12), Japanese Unexamined Patent Publication No. 2004-288672 (Patent Document 13), Japanese Unexamined Patent Publication No. 2005-24377 (Patent Document 1), Japanese Unexamined Patent Publication No. 2005-136302 (Patent Document 14), and Japanese Unexamined Patent Publication No. 2005-136246 (Patent Document 15) disclose a prober structure including probes (contact terminals), an insulating film, and wiring for deriving which are formed by a manufacturing technique of a semiconductor integrated circuit device, a manufacturing method of the same, and a technique for enabling implementation of probe inspection by using the prober against a chip having test pads with a narrow pitch therebetween.

SUMMARY OF THE INVENTION

Inspection techniques for semiconductor integrated circuit devices include probe inspection. The probe inspection includes a function test for confirming whether a predetermined function is performed or not, and a test or the like for determining whether a semiconductor integrated circuit device is a good-quality product or bad-quality one by executing tests of DC and AC operating characteristics. In the probe inspection, a technique for performing the probe inspection of the integrated circuits in the form of wafer is used so as to meet demands, including support for shipment of wafers (differentiation of quality), support for KGD (Known Good Die) (improvement of yields of a MCP (Multi-Chip Package)), and reduction in total costs.

In recent years, multifunctionality of the semiconductor integrated circuit devices has been promoted, and a plurality of circuits have been proposed to be made in one semiconductor chip (hereinafter simply referred to as a "chip"). Furthermore, in order to reduce manufacturing costs of the semiconductor integrated circuit devices, semiconductor elements and wiring are made miniaturized, thereby decreasing an area of the semiconductor chip (hereinafter simply referred to as the "chip"), which increases the number of chips obtained from one semiconductor wafer (hereinafter simply referred to as a "wafer"). For this reason, this leads not only to an increase in number of test pads (bonding pads), but also to a narrow-pitch arrangement of the test pads, which reduces the area of the test pad. When a prober with cantilever-like probes is intended to be used in the above probe inspection, it is difficult to set the probes in alignment with the arrangement positions of the test pads due to the narrow-pitch arrangement of the test pads.

The inventors have studied a technique for enabling implementation of probe inspection of a chip with narrow-pitch test pads by using a prober with probes formed by a manufacturing technique of a semiconductor integrated circuit device. Then, the inventors have found the following problems.

That is, the above-mentioned probe is a part of a membrane probe formed by deposition of a metal film and a polyimide film using a manufacturing technique of a semiconductor integrated circuit device, or by patterning theses films. The probe is provided on a main surface side of the membrane probe opposed to the chip of interest to be inspected. When bringing the probes into contact with test pads, the probes are pressed against the pads from the back side of the membrane probe by a pressing member (pressing piece) attached to the back side of the membrane probe, so that an area of the membrane probe with the probes formed thereon is pushed into. For this reason, when foreign matter is attached to the surface of a wafer of interest to be inspected, a pressing force from the pressing member may be applied to the foreign matter via the membrane probe. A counteraction at this time may break the membrane probe, or attach the foreign matter to the membrane probe. When the foreign matter is attached to the membrane probe, the foreign matter may move again from the membrane probe to the wafer to be inspected and be attached to the wafer. This may lead to reduction in yields of chips.

The above-mentioned pressing member is provided with a hole in the center of a surface thereof opposite to the other surface that is opposed to the membrane probe. Pressing a pressing pin (plunger), such as a spring probe, into the hole causes the pressing force from the pressing member. When the position of attachment of the pressing member on the back side of the membrane probe becomes misaligned, the hole provided in the pressing member and the pressing pin may be misaligned to each other, so that the pressing pin cannot be pressed into the hole.

It is an object of one representative invention disclosed herein to provide a technique that can reduce the possibility of attachment of the foreign matter to a membrane probe when performing probe inspection using the membrane probe formed by a manufacturing technique of a semiconductor integrated circuit device.

It is an object of another representative invention disclosed herein to provide a technique that can perform relative alignment of a pressing member attached to the back side of the membrane probe with a pressing pin for pressing the pressing member when performing probe inspection using the membrane probe formed by a manufacturing technique of a semiconductor integrated circuit device.

The outline of representative features of the invention disclosed in the present application will be briefly described below.

A method of manufacturing a semiconductor integrated circuit device according to one aspect of the invention includes the following steps of: (a) preparing a semiconductor wafer, the wafer being partitioned into a plurality of chip areas, each of which has a semiconductor integrated circuit formed thereover, the wafer having a plurality of first electrodes formed over a main surface thereof and electrically coupled to the semiconductor integrated circuits; (b) preparing a first card, the card including a first wiring substrate having a plurality of first wirings formed thereover, a first sheet having a plurality of contact terminals to be electrically coupled to the first electrodes and a plurality of second wirings electrically coupled to the contact terminals, the second wirings being electrically coupled to the first wirings, the first sheet being held by the first wiring substrate with the tips of the contact terminals being opposed to the main surface of the wafer, and a pressing mechanism for pressing a first area of the first sheet with the contact terminals formed thereover from a back side of the sheet; and (c) performing electric inspection of the semiconductor integrated circuit by bringing the tips of the contact terminals into contact with the first electrodes. The pressing mechanism includes a first pressing portion and a second pressing portion located under the first pressing portion and opposed to the first sheet, the second pressing portion having a relatively smaller plane size than that of the first pressing portion. The pressing mechanism is in contact with the first sheet at the second pressing portion.

A method of manufacturing a semiconductor integrated circuit device according to another aspect of the invention includes the following steps of: (a) preparing a semiconductor wafer, the wafer being partitioned into a plurality of chip areas, each of which has a semiconductor integrated circuit formed thereover, the wafer having a plurality of first electrodes formed over a main surface thereof and electrically coupled to the semiconductor integrated circuits; (b) preparing a first card, the card including a first wiring substrate having a plurality of first wirings formed thereover, a first sheet having a plurality of contact terminals to be electrically coupled to the first electrodes and a plurality of second wirings electrically coupled to the contact terminals, the second wirings being electrically coupled to the first wirings, the first sheet being held by the first wiring substrate with the tips of the contact terminals being opposed to the main surface of the wafer, a pressing mechanism attached to a back side of a first area of the first sheet with the contact terminals formed thereover for pressing the first area from the back side, and a pressurization mechanism for pressurizing the pressing mechanism in a direction toward the first sheet; (c) performing electric inspection of the semiconductor integrated circuit by bringing the tips of the contact terminals into contact with the first electrodes. The pressing mechanism has a hole provided in the center of a second surface thereof opposite to a first surface to which the first sheet is attached. The tip of the pressurization mechanism is in contact with the pressing mechanism through the hole, and the pressurization mechanism is fixed to the first card in alignment with the hole in a horizontal direction with respect to the second surface.

Effects obtained by the typical embodiments of the invention as disclosed in the present application are briefly described below.

Since a contact area between the membrane sheet and the pressing member in contact with the sheet can be as small as possible, even when foreign matter is attached to the surface of the wafer of interest to be inspected, the possibility of contact of the membrane sheet with the foreign matter can be drastically reduced.

DETAILED DESCRIPTION OF THE PREFERRED EMBODIMENTS

Figure 1:
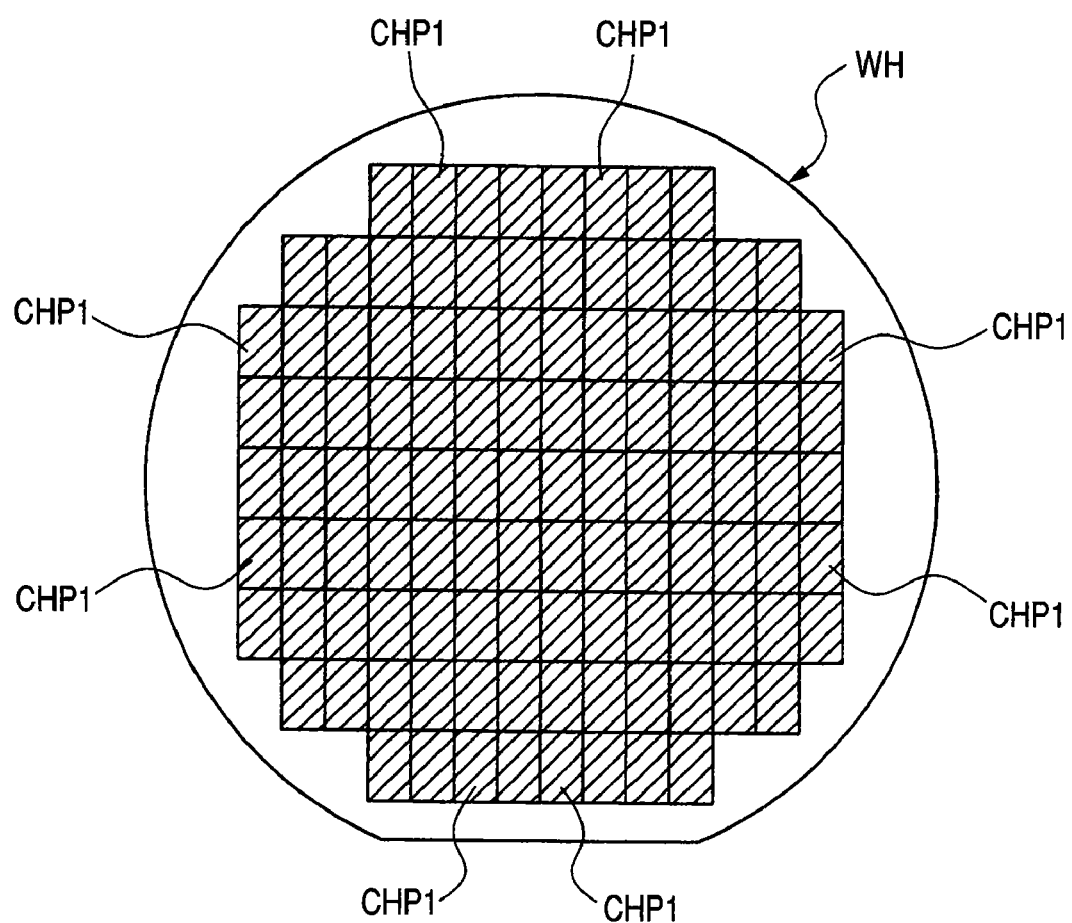
FIG. 1 is a plan view of a semiconductor wafer having semiconductor chip areas of interest to be subjected to probe inspection using a probe card according to one embodiment of the invention.

The terms as used in the present application have the following means, which are explained below before the invention is described in detail.

The term "wafer" as used herein includes a single-crystal silicon substrate (in general, having a substantially disk-like shape) used for manufacturing of integrated circuits, a silicon on insulator (SOI) substrate, an epitaxial substrate, a sapphire substrate, a glass substrate, other insulating, semi-insulating or semiconductor substrates, and a composite substrate thereof. Unless otherwise specified, the term "semiconductor integrate circuit device" as used herein may include not only a semiconductor integrated circuit formed on a semiconductor or insulating substrate, such as a silicon wafer or a sapphire substrate, but also a semiconductor integrated circuit, such as a TFT (Thin Film Transistor) or STN (Super-Twisted-Nematic) liquid crystal, formed on another insulating substrate, such as glass.

The term "device surface" as used herein means a main surface of the wafer, on which device patterns corresponding to a plurality of chip areas are formed by lithography.

The term "contact terminal" or "probe" as used herein means a wiring layer and a tip portion electrically coupled to the wiring layer integrally formed on a silicon wafer by a patterning process of combination of a wafer process, that is, a photo-lithography technique, a CVD (Chemical Vapor Deposition) technique, a sputtering technique, an etching technique, and the like in the same way as in manufacturing of a semiconductor integrated circuit.

The contact terminal or probe is a needle, probe, protrusion, or the like for performing inspection of electric characteristics of the integrated circuit by being brought into contact with an electrode pad provided on each chip area.

The term "membrane probe", "membrane probe card", or "protruding needle wiring sheet composite" as used herein means a membrane which is provided with the contact terminal (protruding needle) contacting the above-mentioned object of interest to be inspected and wiring derived from the terminal with electrodes for external contact formed in the wiring. The membrane has a thickness of about 10 to 100 μm, for example. A manufacturing method of the membrane involves integrally forming a wiring layer and a tip portion (contact terminal) electrically coupled to the wiring layer on the silicon wafer by the patterning process of combination of the wafer process, that is, the photo-lithography technique, the CVD (Chemical Vapor Deposition) technique, the sputtering technique, the etching technique, and the like in the same way as in manufacturing of a semiconductor integrated circuit. Also, a part of the membrane can be separately formed and thereafter combined with the remaining parts into the membrane, while this manufacturing process therefore may be complicated.

The term "probe card" as used herein means a structure including contact terminals in contact with the wafer of interest to be inspected and a multilayer wiring substrate. The term "prober" or "semiconductor inspection device" as used herein means an inspection device having a specimen support system which includes a wafer stage for installing thereon a frog ring, the probe card, and the wafer of interest to be inspected.

The term "probe inspection" as used herein means an electric test applied to the wafer by the prober after completion of a wafer step, and involves performing electric inspection of a semiconductor integrated circuit by bringing the tip of the contact terminal into contact with the electrode formed on the main surface of the chip area. The probe inspection is to determine whether a semiconductor integrated circuit device is a good-quality product or bad-quality one by executing the function test for confirming whether a predetermined function is performed or not, or the tests for DC and AC operating characteristics. These tests are distinguished from a selection test (last test) performed after division into the chips (or after completion of packaging).

The term "POGO pin" or "spring probe" as used herein means a contact needle having a structure in which a contact pin (plunger (contact needle)) is pressed against the electrode (terminal) by an elastic force of a spring (coil spring), and which is adapted to be electrically coupled to the electrode, if necessary. For example, the pogo pin or spring probe has a structure in which a spring disposed in a metal pipe (holding member) transfers an elastic force to the contact pin via a metal ball.

The term "tester (Test System)" as used herein means a system for electrically inspecting the semiconductor integrated circuit, and for generating a predetermined voltage and a signal of timing or the like as the reference.

The term "tester head" as used herein means one which is electrically coupled to the tester, receives the voltage and signal transmitted from the tester, generates the voltage and signal of the detailed timing or the like to the semiconductor integrated circuit, and sends the signal to the probe card via the pogo pin or the like.

The term "frog ring" as used herein is one electrically coupled to the tester head and the probe card via the pogo pin, and transfers the signal sent from the tester head to the probe card to be described later.

The following embodiments will be described by being divided into a plurality of sections or embodiments if necessary for convenience. However, unless otherwise specified, they are not irrelevant to one another. One of the embodiments has to do with modifications, details and supplementary explanations of a part or all of the other.

When reference is made to the number of elements or the like (including the number of pieces, numerical values, quantity, range, etc.) in the following description of the embodiments, the number thereof is not limited to a specific number, and may be greater than, or less than, or equal to the specific number, unless otherwise specified and definitely limited to the specific number in principle.

It is also needless to say that components (including elements or process steps, etc.) employed in the following description of the embodiments are not always essential, unless otherwise specified and considered to be definitely essential in principle.

Similarly, when reference is made to the shapes, positional relations and the like of the components or the like in the following description of the embodiments, they will include ones substantially analogous or similar to their shapes or the like, unless otherwise specified and considered not to be definitely so in principle, etc. This is similarly applied even to the above-described numerical values and range.

In the following description of materials or the like, unless otherwise specified, or except for when the principle or condition is not applicable, materials or the like as specified are intended to mean main materials, but are not intended to exclude additional elements, additives, adducts, and the like. For example, unless otherwise specified, a silicon member may contain not only pure silicon, but also additive impurities, and binary or ternary alloy (for example, SiGe) or the like mainly including silicon.

Components having the same functions are designated by the same reference numerals through all drawings for explaining the embodiments of the invention, and the repeated description thereof will be omitted.

In all the drawings for explaining the embodiments, some hatched areas are given even in plan views for clarification of the structure of each component.

The details of a membrane probe produced by the semiconductor lithography technique as used herein are disclosed in the following patent documents filed by the inventor and his associates, and thus the description of the contents of these documents will not be repeated below unless necessary. The above-mentioned patent documents are Japanese Unexamined Patent Publication No. Hei 6(1994)-22885, Japanese Unexamined Patent Publication No. Hei 7(1995)-283280, Japanese Unexamined Patent Publication No. Hei 8(1996)-50146, Japanese Unexamined Patent Publication No. Hei 8(1996)-201427, Japanese Unexamined Patent Publication No. Hei 9(1997)-119107, Japanese Unexamined Patent Publication No. Hei 11(1999)-23615, Japanese Unexamined Patent Publication No. 2002-139554, Japanese Unexamined Patent Publication No. Hei 10(1998)-308423, Japanese Unexamined Patent Publication No. Hei 9(1997)-189660, Japanese Unexamined Patent Publication No. Hei 11(1999)-97471, Japanese Unexamined Patent Publication No. 2000-150594, Japanese Unexamined Patent Publication No. 2001-159643, Japanese Patent Application No. 2002-289377 (corresponding to U.S. patent application Ser. No. 10/676,609; U.S. filing date: Oct. 2, 2003), Japanese Unexamined Patent Publication No. 2004-132699, Japanese Unexamined Patent Publication No. 2005-24377, Japanese Unexamined Patent Publication No. 2004-288672 (corresponding to U.S. patent application Ser. No. 10/765,917; U.S. filing date Jan. 29, 2004), Japanese Unexamined Patent Publication No. 2004-144742 (corresponding to US Patent Application No. 2004/070,413), Japanese Unexamined Patent Publication No. 2004-157127, Japanese Unexamined Patent Publication No. 2005-136246 (corresponding to U.S. patent application Ser. No. 10/968,215; U.S. filing date: Oct. 20, 2004), Japanese Unexamined Patent Publication No. 2005-136302 (corresponding to U.S. patent application Ser. No. 10/968,431; U.S. filing date: Oct. 20, 2004), Japanese Unexamined Patent Publication No. 2004-115048, Japanese Unexamined Patent Publication No. 2004-208213, PCT Application No. JP 2004/17160, PCT Application No. JP 2005/4344, Japanese Patent Application No. 2004-378504, Japanese Patent Application No. 2005-109350, Japanese Patent Application No. 2005-168112, Japanese Patent Application No. 2005-181085, Japanese Patent Application No. 2005-194561, Japanese Patent Application No. 2005-291886, Japanese Patent Application No. 2005-327183, Japanese Patent Application No. 2006-29468, Japanese Patent Application No. 2006-136596, and Japanese Patent Application No. 2006-173680.

Preferred embodiments of the invention will be described below in detail with reference to the accompanying drawings.

Figure 2:
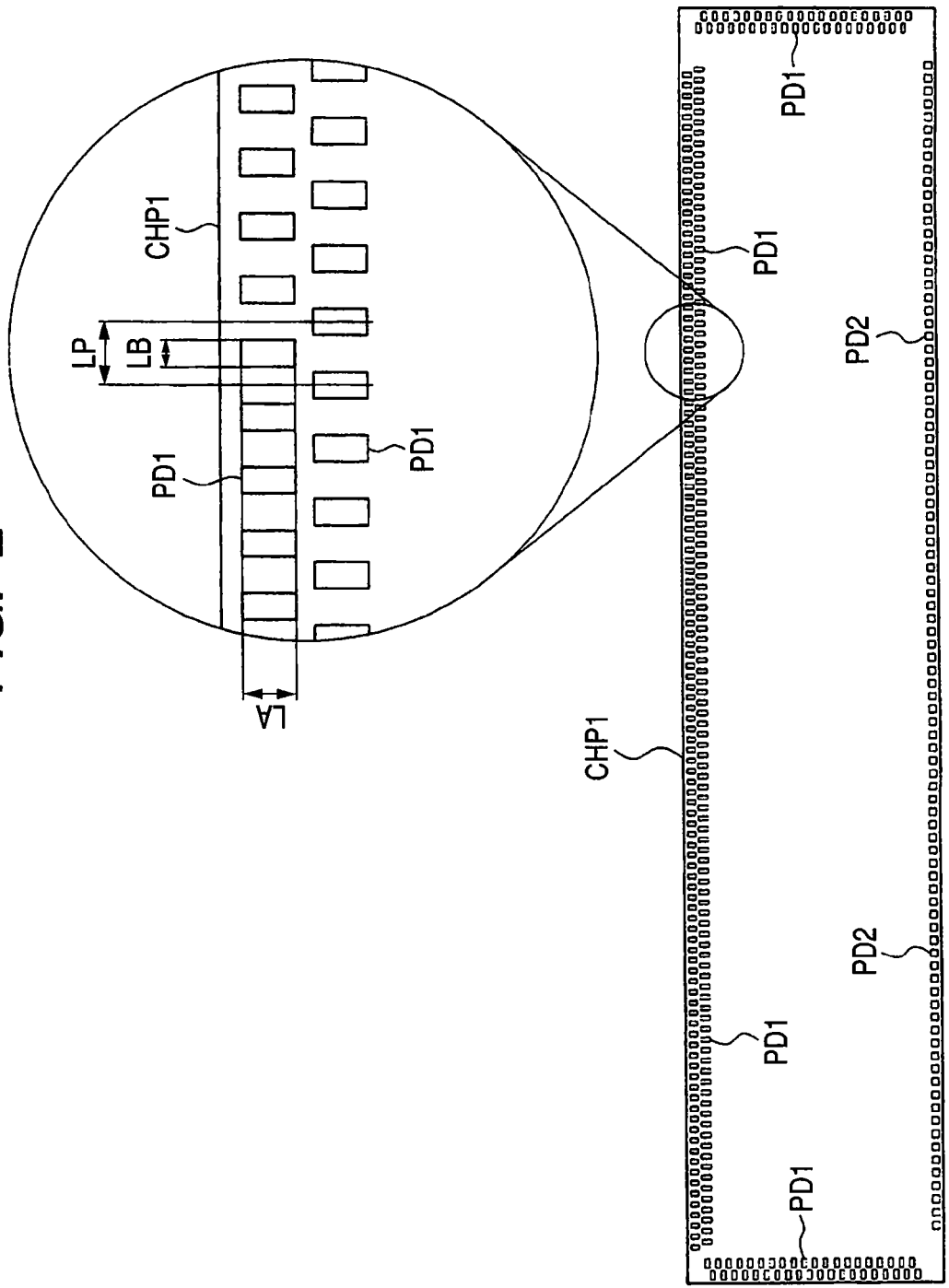
FIG. 2 is a plan view of a semiconductor chip of interest to be subjected to the probe inspection using the probe card of the embodiment.

Probe inspection using a probe card of this embodiment is applied to a substrate WH in the form of wafer that is partitioned into a plurality of chips. FIG. 1 is a plan view of the wafer WH that is partitioned into the chips (chip areas) CHP1s, and FIG. 2 shows a plane of the chip CHP1 and an enlarged part thereof.

The probe inspection using the probe card of this embodiment is applied to the wafer WH that is partitioned into chips CHP1s. The wafer WH is made of, for example, a simple-crystal silicon substrate. A LCD driver circuit (semiconductor integrated circuit) is formed on the main surface of each of the chips CHP1s. A number of pads (test pads (first electrodes)) PD1 and PD2 which are electrically coupled to the LCD driver circuit are disposed in the periphery of the main surface of the chip CHP1. The pads PD1 arranged along the upper long side and both short sides of the chip CHP1 shown in FIG. 2 serve as output terminals, and the pads PD2 arranged along the lower long side of the chip CHP1 serve as input terminals. The number of the output terminals of the LCD driver is larger than that of the input terminals. In order to make a distance between the adjacent pads PD1s as wide as possible, the pads PD1s are arranged in two rows along the upper long side and both short sides of the chip CHP1. Further, both lines of the pads PD1s are alternately arranged along the upper long side and both short sides of the chip CHP1. In this embodiment, a pitch LP located between the adjacent pads PD1s is, for example, about 40 μm or less in length. In this embodiment, the pad PD1 has a rectangular plane. The length LA of the long side of the pad PD1 extending in a direction of intersecting (perpendicular to) the outer periphery of the chip CHP1 is about 100 μm. The length LB of the short side of the pad PD1 extending along the outer periphery of the CHP1 is about 18 μm. Since the pitch LP located between the adjacent pads PD1s is about 40 μm and the length LB of the short side of the pad PD1 is about 18 μm, the distance between the adjacent pads PD1s is about 22 μm.

Figure 3:
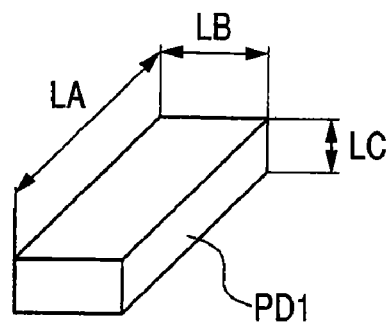
FIG. 3 is a perspective view of a pad formed on the semiconductor chip as shown in FIG. 2.

The pads PD1 and PD2 are bump electrodes (protruding electrodes) made of, for example, gold (Au). The pads are formed on input and output terminals (bonding pads) on the chip CHP1 by electro plating, electroless plating, vapor deposition, or sputtering. FIG. 3 is a perspective view of the pad PD1. The height LC of the pad PD1 is about 25 μm. The pad PD2 has substantially the same height as that of the pad PD1.

The above chip CHP1 can be manufactured by forming the LCD driver circuit (semiconductor integrated circuit) and the input and output terminals (bonding pads) on a number of chip areas partitioned into on the main surface of the wafer WH by the semiconductor manufacturing technique, by forming the pads PD1 and PD2 on the input and output terminals by the above-mentioned method, and then by dicing the wafer into individual chip areas. In the following description of the probe inspection (step of bringing the probes into contact with the pads PD1 and PD2), unless otherwise specified, the term "chip CHP1" as used herein means each chip area before dicing the wafer.

Figure 4:
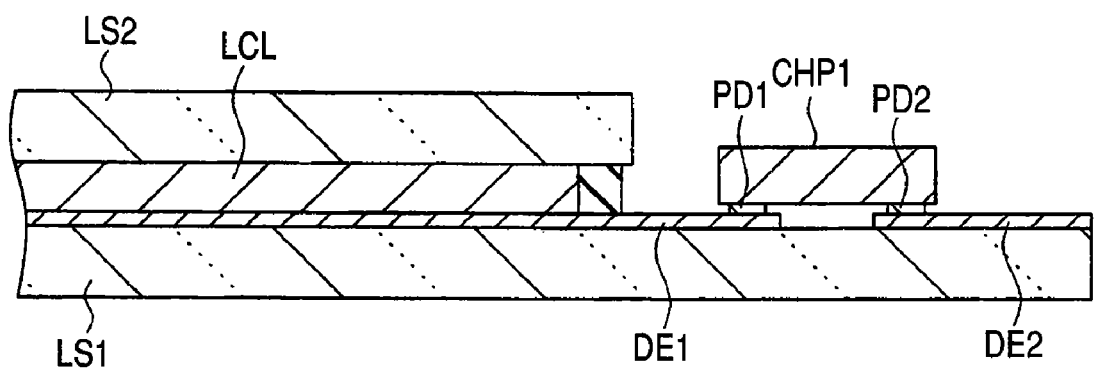
FIG. 4 is a sectional view of a main part for explaining a coupling method of the semiconductor chip shown in FIG. 3 to a liquid crystal panel.

FIG. 4 is a sectional view of a main part for explaining a coupling method of the chip CHP1 to a liquid crystal panel. As shown in FIG. 4, the liquid crystal panel has a glass substrate LS1 with pixel electrodes DE1 and DE2 formed on a main surface thereof, a liquid crystal layer LCL, and a glass substrate LS2 opposed to the glass substrate LS1 via the liquid crystal layer LCL. In this embodiment, the chip CHP1 is face-down bonded such that the pads PD1 and PD2 are coupled to the pixel electrodes DE1 and DE2, respectively, on the glass substrate LS1 of such a liquid crystal panel, so that the chip CHP1 can be coupled to the liquid crystal panel.

Figure 5:
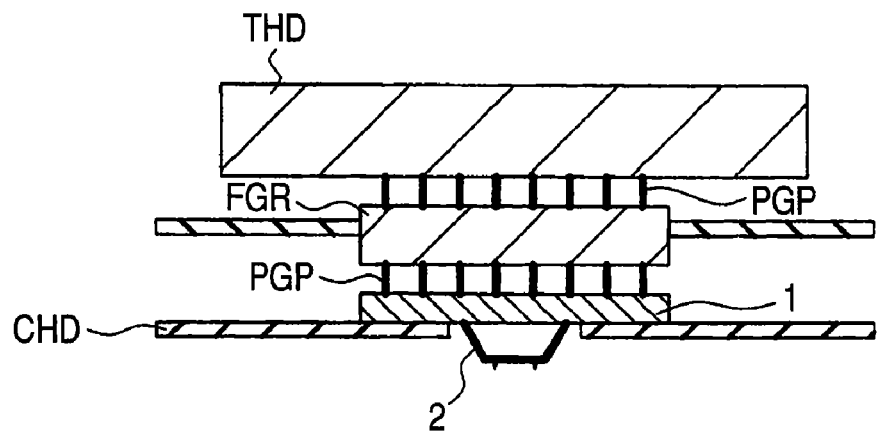
FIG. 5 is a sectional view of a main part of the probe card of the embodiment.

FIG. 5 is a sectional view of a main part of the probe card (first card) of this embodiment. As shown in FIG. 5, the probe card of this embodiment includes a multilayer wiring substrate (first wiring substrate) 1, a membrane sheet (first sheet) 2, a tester head THD, a frog ring FGR, and a card holder CHD. The tester head THD and the frog ring FGR are electrically coupled to each other via a plurality of pogo pins PGPs. Similarly, the frog ring FGR and the multilayer wiring substrate 1 are also electrically coupled to each other via the pogo pins PGPs. Thus, the tester head THD and the multilayer wiring substrate 1 are electrically coupled to each other. The card holder CHD is to mechanically couple the multilayer wiring substrate 1 to the prober, and has enough mechanical strength to prevent warpage of the multilayer wiring substrate 1 due to the pressure from the pogo pins PGPs.

Figure 6:
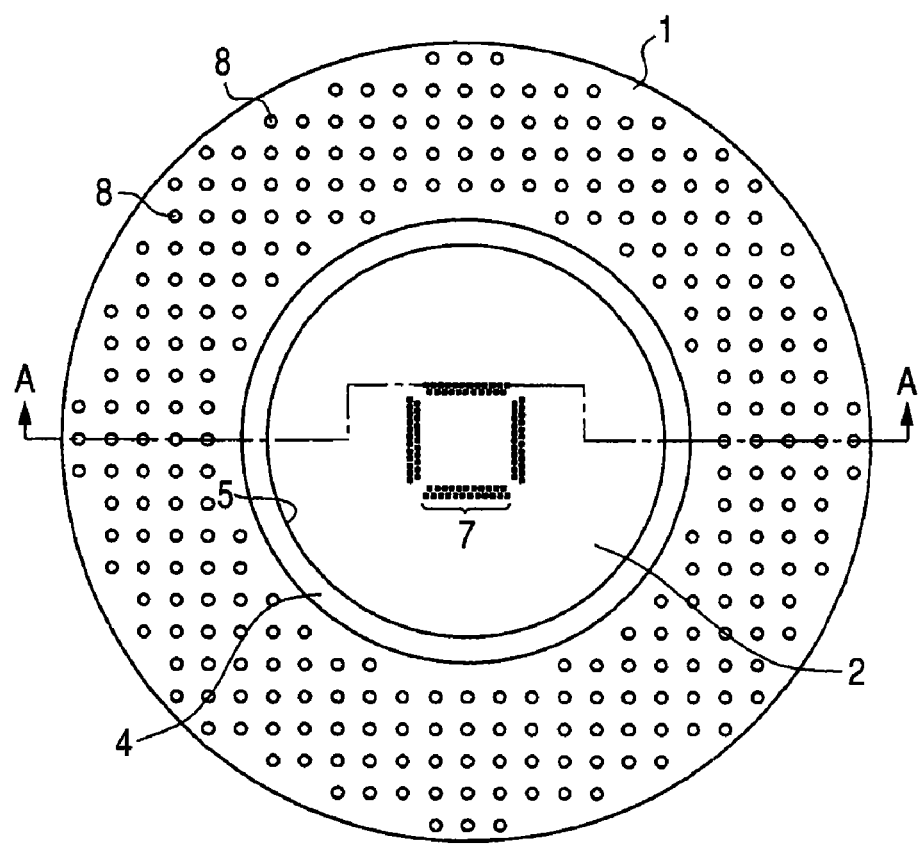
FIG. 6 is a plan view of a main part of the underside of the probe card of the embodiment.
Figure 7:
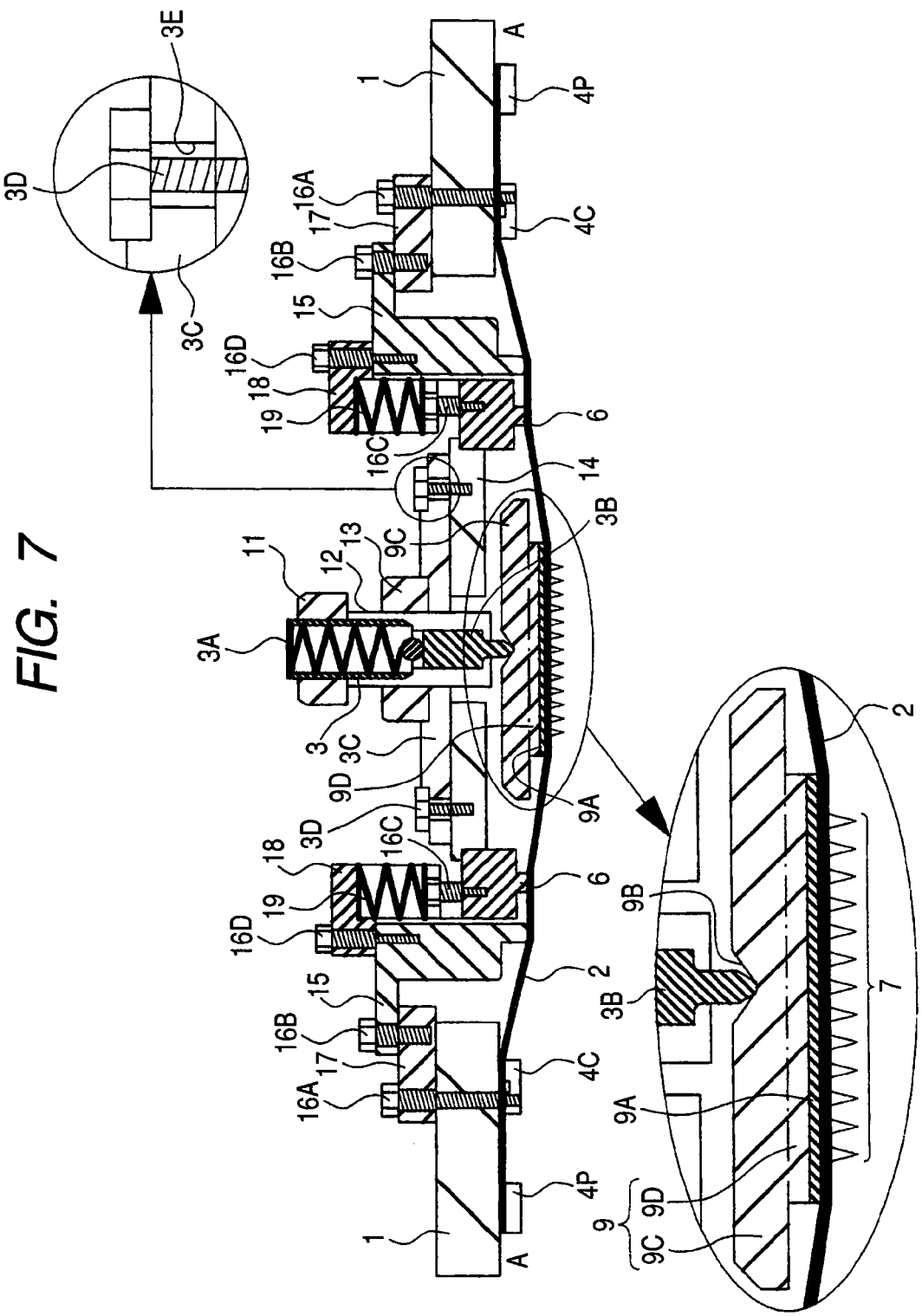
FIG. 7 is a sectional view taken along the line A-A in FIG. 6.

FIG. 6 is a plan view of a main part of the underside of the probe card of this embodiment. FIG. 7 is a sectional view taken along the line A-A in FIG. 6. FIG. 7 also shows an enlarged view of a part of the section of the probe card.

As shown in FIGS. 6 and 7, the probe card of this embodiment includes, for example, a plunger (pressing mechanism) 3, as well as the members shown in FIG. 5. The membrane sheet 2 is fixed to the lower surface of the multilayer wiring substrate 1 by a contact ring 4c and a process ring 4p, and the plunger 3 is attached to the upper surface of the multilayer wiring substrate 1. An opening 5 is provided in the center of the multilayer wiring substrate 1, and the membrane sheet 2 is bonded to an adhesive ring 6 in the opening 5.

A plurality of probes (contact terminals) 7 having, for example, a four-sided pyramid shape or a four-sided pyramid trapezoidal shape are formed on the lower surface of the membrane sheet 2. A plurality of wirings (second wirings) electrically coupled to the respective probes 7 are formed in the membrane sheet 2 to extend from the respective probes 7 to the end of the membrane sheet 2. A plurality of receiving portions (not shown) electrically coupled to the ends of the wirings are formed on the lower surface of the multilayer wiring substrate 1. These receiving portions are electrically coupled to the pogo seats 8 provided on the upper surface of the multilayer wiring substrate 1 through the wirings (first wirings) formed in the multilayer wiring substrate 1. This pogo seat 8 has a function for receiving pins that introduce a signal from the tester into the probe card.

In this embodiment, the membrane sheet 2 is formed of a membrane mainly including polyimide, for example, and has flexibility. The plunger 3 is pressed against an area (first area) of the membrane sheet 2 with the probes 7 formed thereon, from the upper surface (back side) via a pressing member (pressing mechanism) 9. By pushing the pressing member 9, the membrane sheet 2 extends, and thus the positions of the tips of the probes 7 are adjusted to those opposed to the respective pads PD1 and PD2. The plunger 3 is fixed to a casing 12 by a nut 11, the casing 12 is fixed to a plunger holding member 3C by a nut 13, and the plunger holding member 3C is fixed to a loading jig 14 by bolts 3D. A spring 3A is accommodated in the plunger 3. An elastic force of the spring 3A transfers a certain pressing force to the pressing member 9 and the membrane sheet 2 via a pressing pin 3B. In this embodiment, material for the pressing member 9 can include, for example, 42 alloy. The pressing member 9 is attached to the upper surface of the membrane sheet 2 by an epoxy adhesive member 9A.

The multilayer wiring substrate 1 and an overhanging ring 15 are attached to a coupling jig 17 by the bolts 16A and 16B, respectively, to be connected to each other via the coupling jig 17. The overhanging ring 15 is used to overhang an area of the membrane sheet 2 with the probes 7 formed, from the lower surface of the multilayer wiring substrate 1. The loading jig 14 is coupled to the adhesive ring 6 by bolts 16C. A spring pressing jig 18 is attached to the overhanging ring 15 by bolts 16D. Springs 19 are disposed between the spring pressing jig 18 and the loading jig 14 (bolt 16C). These springs 19 are disposed, for example, on a plane of the multilayer wiring substrate 1 in about 8 to 12 positions (not shown). The elastic force of the springs 19 acts on the loading jig 14 (bolts 16C) when the probes 7 is brought into contact with the pads PD1 and PD2 in performing the probe inspection, and the probe card is pushed toward the pads PD1 and PD2. At this time, since the loading jig 14, the pressing member 9, the coupling ring 9, and the plunger 3 are fixed and integrated by the nuts 11, 13 and the bolts 16c, the elastic force of the springs 19 acts on these integrated members such that they are pressed down toward the pads PD1 and PD2. As a result, the pressing force transferred from the spring 3A in the plunger 3 to the membrane sheet 2 is used only to extend the membrane sheet 2.

In the probecard of this embodiment with the above-mentioned structure, the probes 7 can be brought into contact with the pads PD1 and PD2 by a low load. Even when the chip CHP1 is structured to have wirings and elements under the pads PD1 and PD2, the wirings and elements can be prevented from breaking by the load caused when the probes 7 come into contact with the pads PD1 and PD2 in the probe inspection.

When an interlayer dielectric disposed between an upper layer wiring and a lower layer wiring and used in the chip CHP1 for a quick circuit operation is an insulating film having a low mechanical strength and a low relative dielectric constant (for example, a silica glass-based CVD Low-k (low dielectric constant) insulating film having the relative dielectric constant below about 3.0, for example, a film made of SiOC or the like, or a carbon-containing silicon oxide CVD Low-k insulating film, or a porous structure or the like made of material similar to the materials described above and not by CVD)), the following problem may be posed. In this case, the insulating film or circuit may be disadvantageously broken due to the load caused when the probes are brought into contact with the pads PD1 and PD2 in the probe inspection. However, the use of the probe card of this embodiment can bring the probes 7 into contact with the pads PD1 and PD2 by the low load, which can prevent such a disadvantage.

Furthermore, according to the probecard of this embodiment, the probes 7 can be brought into contact with the pads PD1 and PD2 by the low load, so that the damage to the probes 7 can be reduced drastically when the probes 7 touch the pads PD1 and PD2.

The pressing member 9 includes a pressing pin receiving portion (first pressing portion) 9C relatively disposed above for receiving the tip of the pressing pin 3B of the plunger 3 in a recess (hole) 9B, and a membrane sheet pressing portion (second pressing portion) 9D relatively disposed below. The lower surface of the membrane sheet pressing portion 9D is attached to the membrane sheet 2 by an adhesive member 9A. In the probe inspection, a wafer WH is placed on a wafer stage (not shown). When the stage on which the wafer WH is placed has a warpage, for example, in vacuum-sucking the wafer WH on the surface, the wafer WH is deformed along the warpage of the stage or along a suction hole through which the wafer WH is vacuum-sucked. Thus, the warpage of the stage surface or the shape of the suction hole is reflected in the wafer WH. In such a condition, when the tips of the probes 7 are intended to contact the respective pads PD1 and PD2, some parts of the probes 7 may not disadvantageously come into contact with the respective pads PD1 and PD2 due to an influence by the warpage or the like. In the probecard of this embodiment, however, the pressing member 9 is pressed against the membrane sheet 2 by allowing the pressing pin 3B of the plunger 3 to press the recess 9B provided in the pressing member 9. Thus, the pressing member 9 can press the membrane sheet 2 which tends to be inclined along the shape of the warpage or the like. That is, all probes 7 can be surely brought into contact with the respective pads PD1 and PD2.

A hole (screw hole) 3E through which the bolt (screw) 3D passes is provided in the plunger holding member 3C. Each hole 3E has an opening diameter (for example, about 2.5 mm) larger than that of the bolt 3D (for example, about 2 mm). The bolts 3D reach the loading jig 14 through these holes 3E, and are screwed to fix the plunger holding member 3C to the loading jig 14. When the attached position of the pressing member 9 on the upper surface of the membrane sheet 2 becomes misaligned, the tip of the pressing pin 3B of the plunger 3 and the recess 9B of the pressing member 9 may be relatively misaligned to each other, so that the tip of the pressing pin 3B may not be opposed accurately to the recess 9B. Accordingly, in this embodiment, the opening diameter of the hole 3E provided in the plunger holding member 3C is formed to be larger than the diameter of the bolt 3D. The relative misalignment between the tip of the pressing pin 3B and the recess 9B is corrected by modifying the position of the plunger holding member 3C before screwing the bolts 3D. The bolts 3D can be screwed with the tip of the pressing pin 3B and the recess 9B opposed accurately to each other, thereby fixing the plunger holding member 3C to the loading jig 14.

Figure 8:
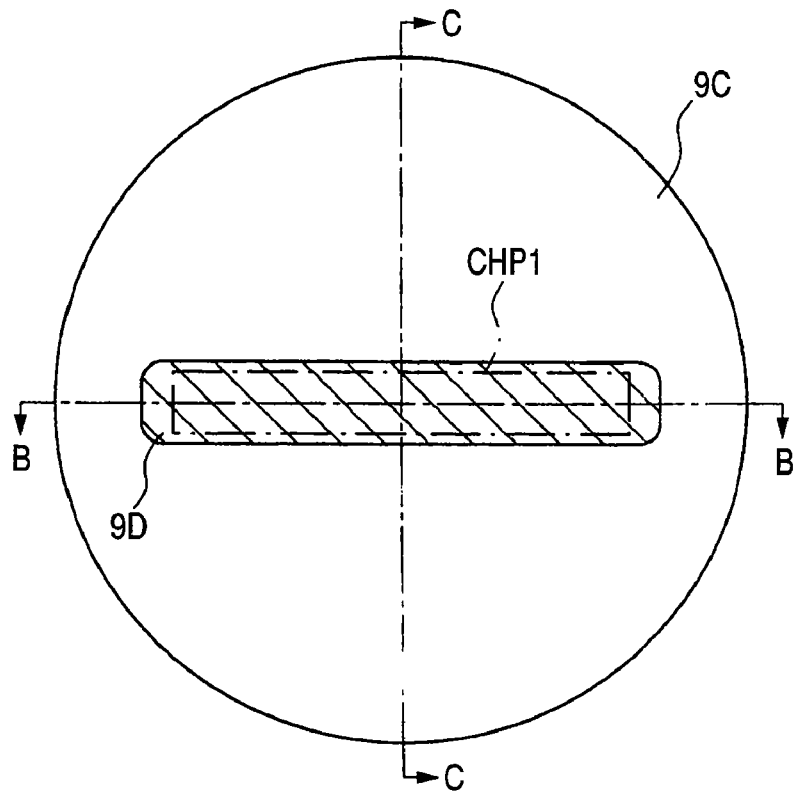
FIG. 8 is a plan view of a main part of a membrane sheet included in the probe card of the embodiment.
Figure 9:
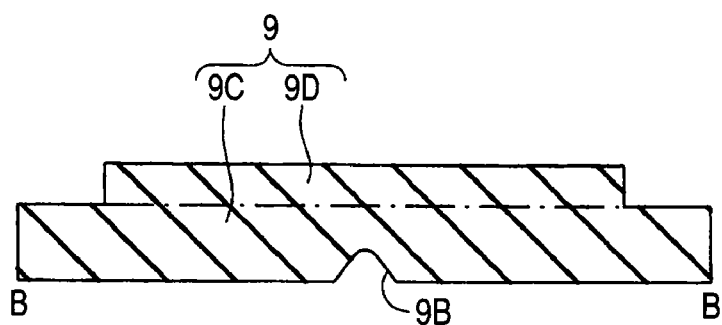
FIG. 9 is a sectional view taken along the line B-B in FIG. 8.
Figure 10:
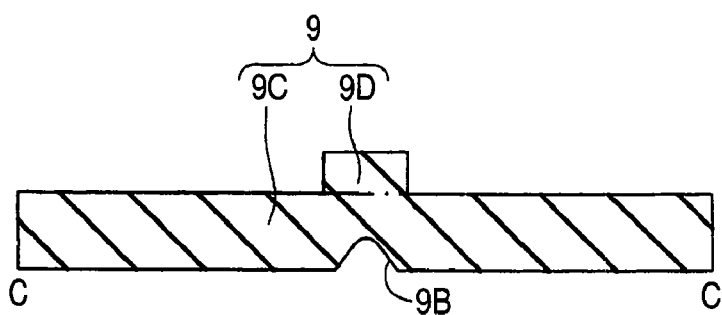
FIG. 10 is a sectional view taken along the line C-C in FIG. 8.

FIG. 8 is a plan view of a main part showing a positional relationship between the pressing member 9 (the pressing pin receiving portion 9C and the membrane sheet pressing portion 9D) and the chip CHP1 to be subjected to the probe inspection (which the probes 7 contact). FIGS. 9 and 10 are sectional views taken along the ling B-B and C-C in FIG. 8, respectively. FIGS. 8 to 10 show cases in which a plurality of probes 7 provided in the membrane sheet 2 are brought into contact with one chip CHP1.

As shown in FIG. 8, the membrane sheet pressing portion 9D of the pressing member 9 which is in contact with the membrane sheet 2 has the minimum plane size to enable pressing of the entire surface of one chip CHP1 of interest to be subjected to the probe inspection. Also, as shown in FIG. 7, the membrane sheet 2 is attached to the probe card such that the sheet becomes apart from the wafer WH of interest to be inspected as being distant from the membrane sheet pressing portion 9D. The load from the pressing member 9 is applied only to a bonding part between the membrane sheet pressing portion 9D and the membrane sheet 2. Thus, the size of the area of the membrane sheet 2 which contacts the wafer WH and to which the load from the pressing member 9 is applied can be minimized in performing the probe inspection. As a result, even when the foreign matter is attached to the surface of the wafer WH of interest to be inspected, the possibility of contact of the membrane sheet 2 with the foreign matter can be drastically reduced. When the membrane sheet 2 contacts the foreign matter, the sheet 2 may be disadvantageously broken. However, this embodiment can drastically reduce the possibility of this disadvantage. The membrane sheet pressing portion 9D can have a plane area that is substantially equal to or less than about half of that of the pressing pin receiving portion 9C.

Figure 11:
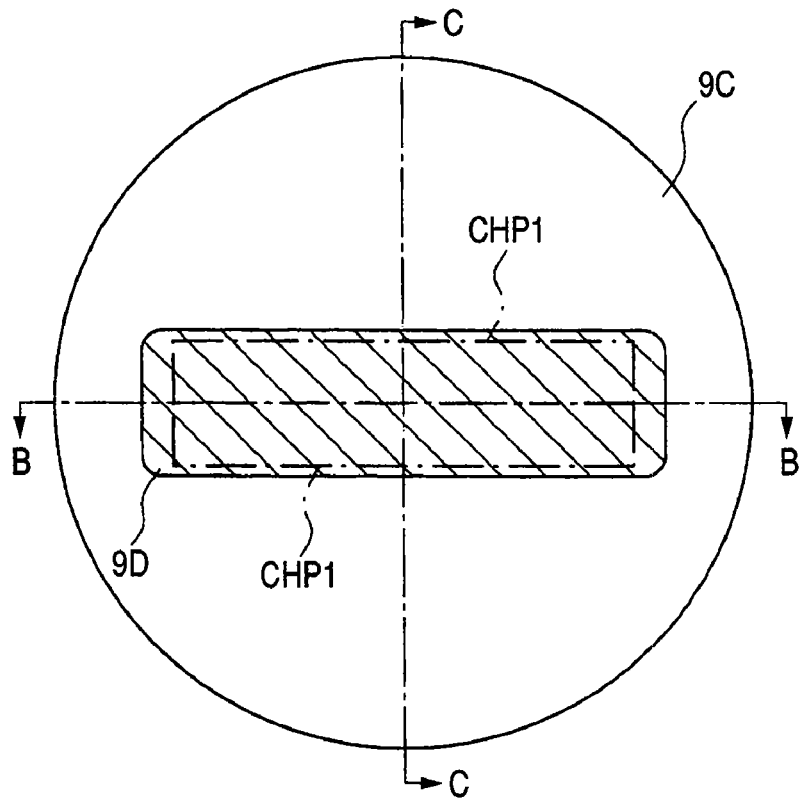
FIG. 11 is a plan view of a main part of a membrane sheet included in a probe card of another embodiment.
Figure 12:
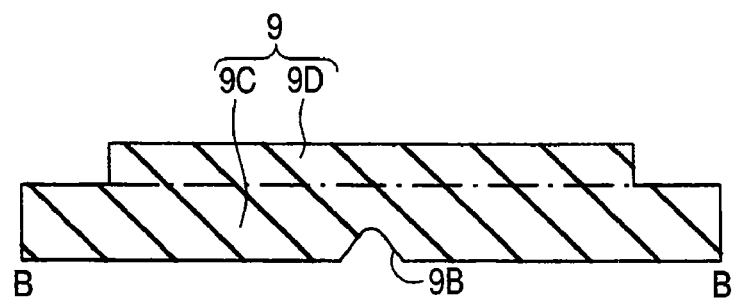
FIG. 12 is a sectional view taken along the line B-B in FIG. 11.
Figure 13:
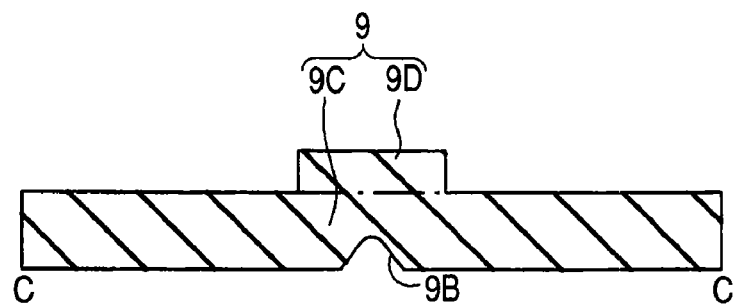
FIG. 13 is a sectional view taken along the line C-C in FIG. 11.

FIG. 11 is a plan view of a main part showing a positional relationship between the pressing member 9 (the pressing pin receiving portion 9C and the membrane sheet pressing portion 9D) and two chips CHP1s when the probes 7 provided in the membrane sheet 2 are in contact with two chips CHP1S. FIGS. 12 and 13 are sectional views taken along the lings B-B and C-C in FIG. 11, respectively. FIG. 11 shows a case where two chips CHP1s are disposed adjacent to each other along the long side. According to this embodiment, also when the probes 7 provided in the membrane sheet 2 are in contact with such two chips CHP1s, the size of the area of the membrane sheet 2 which contacts the wafer WH and to which the load from the pressing member 9 is applied can be minimized in performing the probe inspection.

Figure 14:
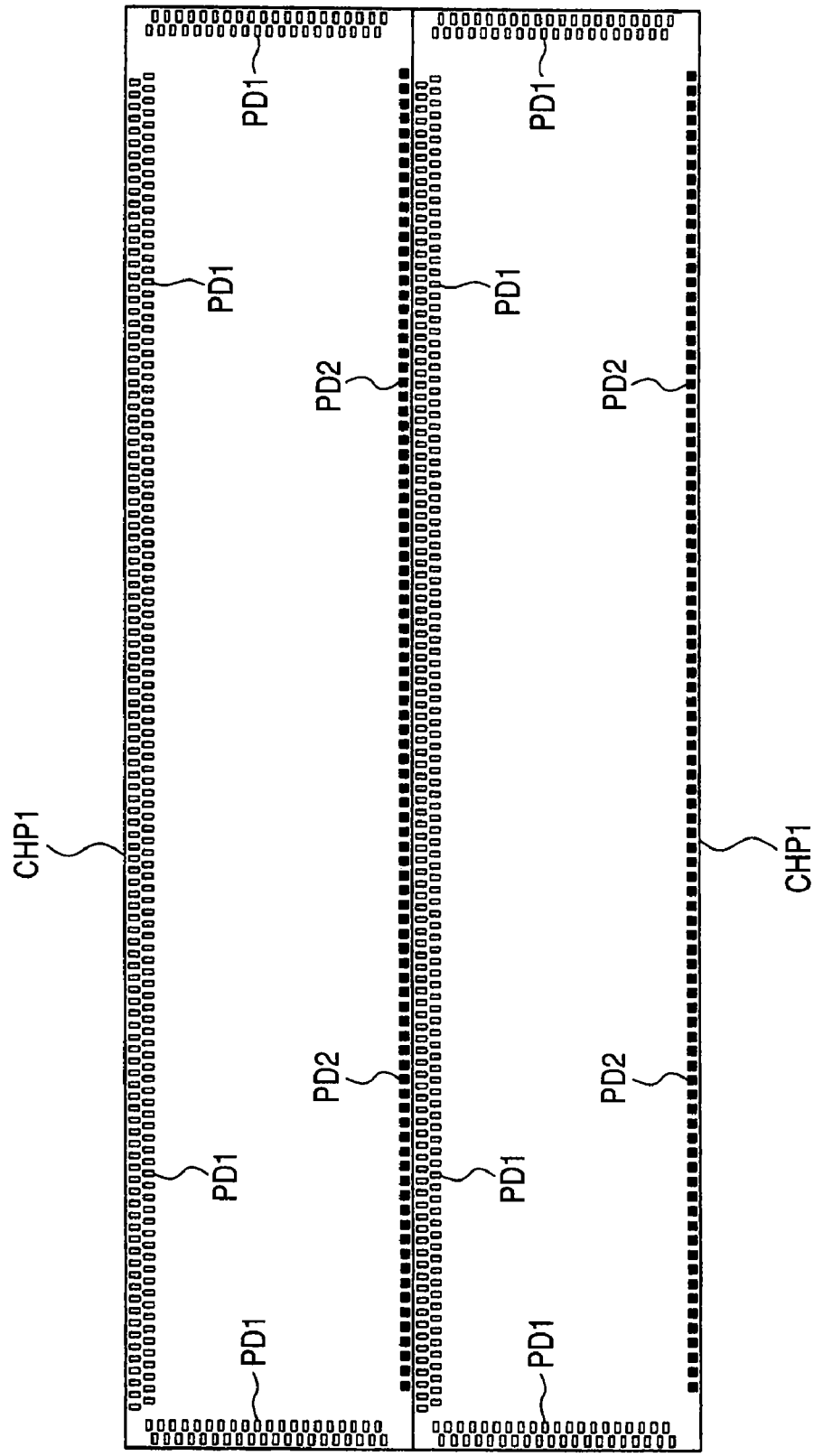
FIG. 14 is a plan view of two semiconductor chips of interest to be subjected to the probe inspection using a probe card of another embodiment.
Figure 15:
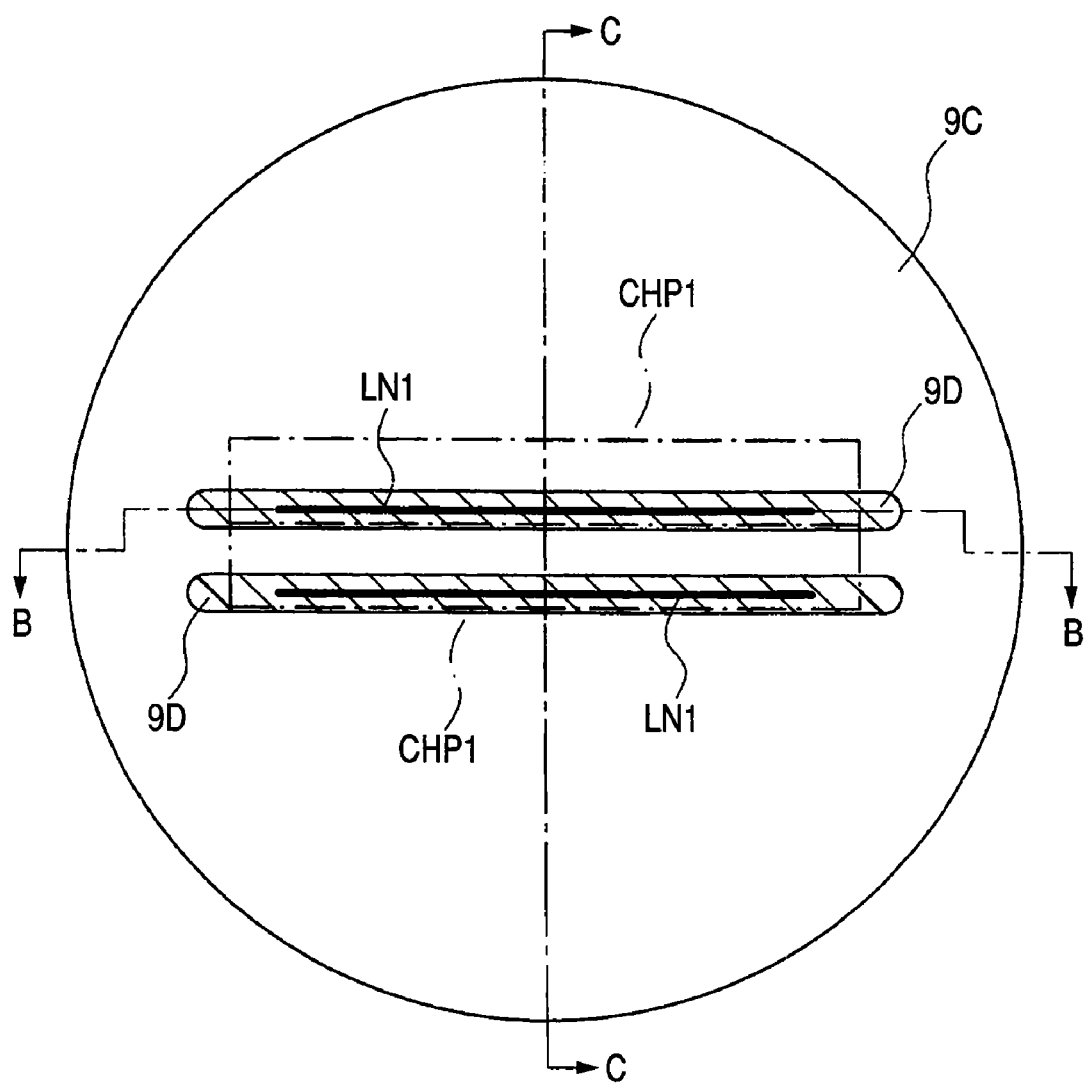
FIG. 15 is a plan view of a main part of the membrane sheet included in the probe card of the embodiment.
Figure 16:
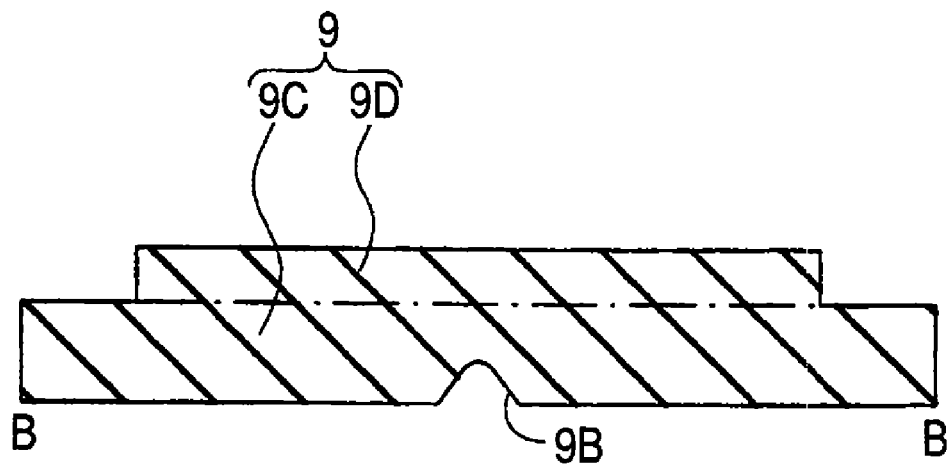
FIG. 16 is a sectional view taken along the line B-B in FIG. 15.
Figure 17:
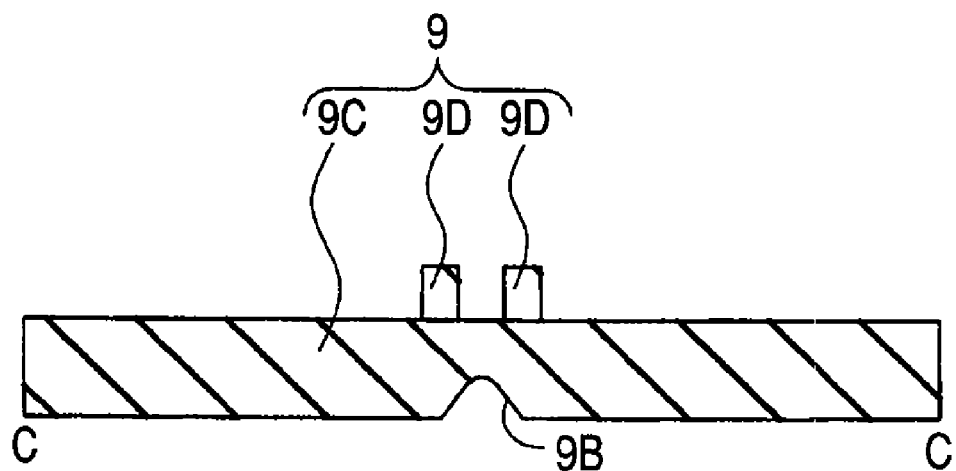
FIG. 17 is a sectional view taken along the line C-C in FIG. 15.

FIG. 14 is a plan view of a main part showing the two chips CHP1s when the probes 7 provided in the membrane sheet 2 are in contact with only the pads PD2 of the two chips CHP1s, wherein the pads PD2s are represented by hatched areas. FIG. 15 is a plan view of a main part showing a positional relationship between the pressing member 9 (the pressing pin receiving portion 9c and the membrane sheet pressing portion 9D) and the two chips CHP1s at that time. FIG. 16 and FIG. 17 are sectional views taken along the lines B-B and C-C in FIG. 15, respectively. FIGS. 14 and 15 show a case where the two chips CHP1s are disposed adjacent to each other along the long side. The lines LN1s in FIG. 15 correspond to the positions of the pads PD2s on the plane. In such a case, each membrane sheet pressing portion 9D of the pressing member 9 has the minimum plane size to enable pressing only of the pad PD2 which the probes 7 are to contact. This minimum plane size can be smaller than the plane size of the membrane sheet pressing portion 9D shown in FIG. 11, which is an example of contact with the same two chips CHP1s.

Figure 18:
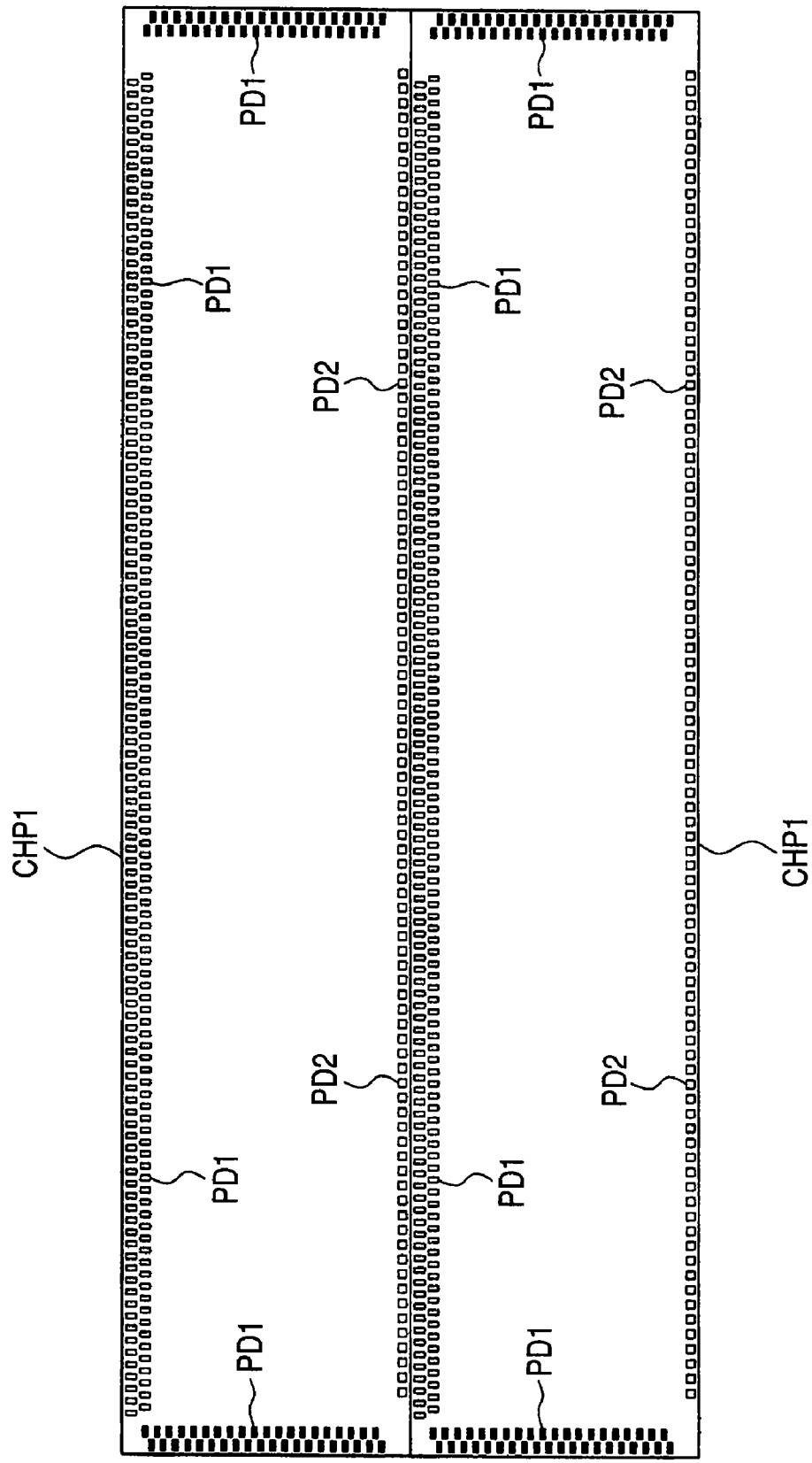
FIG. 18 is a plan view of two semiconductor chips of interest to be subjected to the probe inspection using a probe card of another embodiment.
Figure 19:
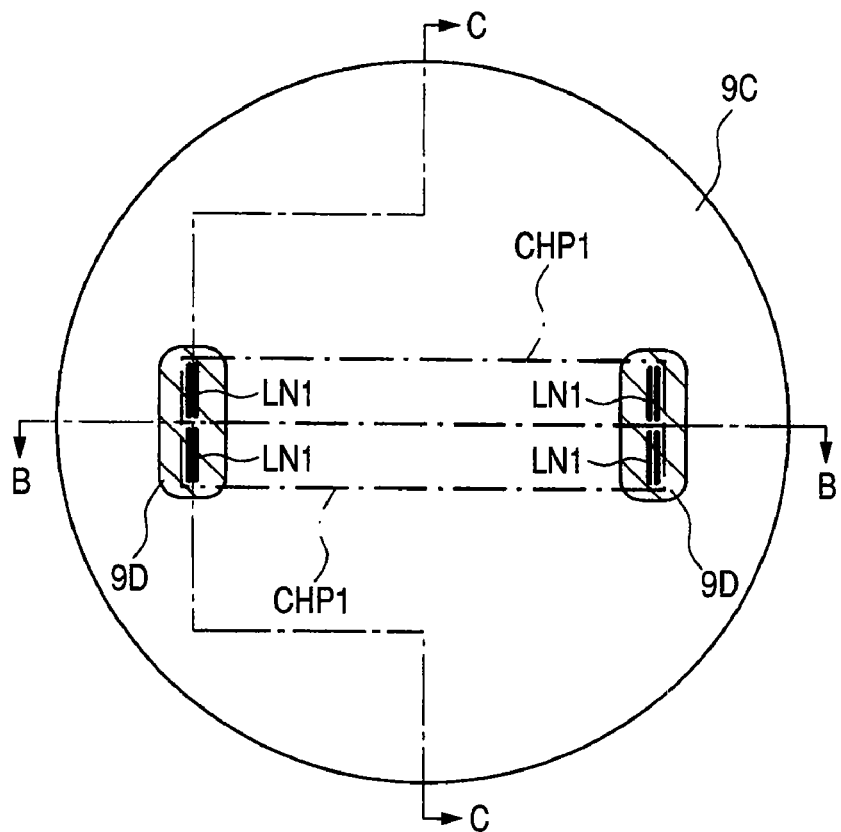
FIG. 19 is a plan view of a main part of the membrane sheet included in the probe card of the embodiment.
Figure 20:
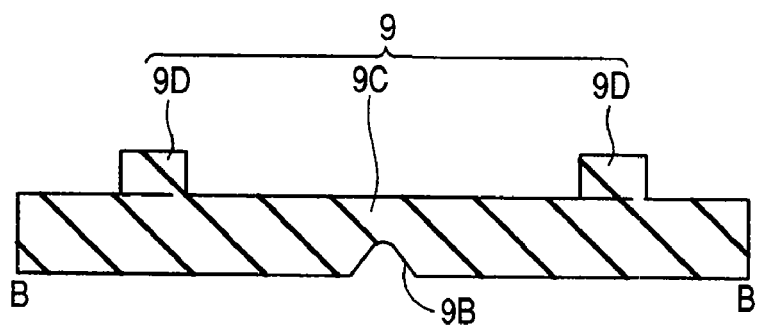
FIG. 20 is a sectional view taken along the line B-B in FIG. 19.
Figure 21:
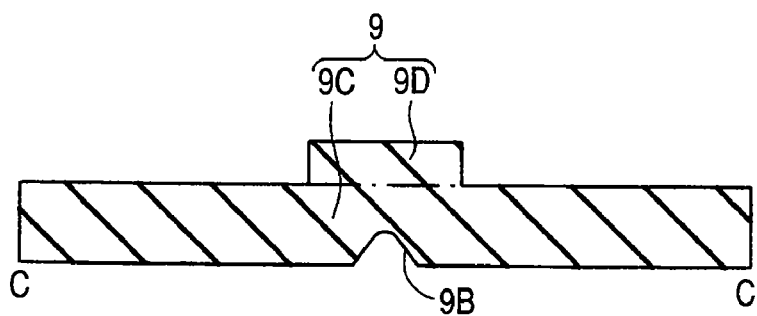
FIG. 21 is a sectional view taken along the line C-C in FIG. 19.

FIG. 18 is a plan view of a main portion showing the two chips CHP1s when the probes 7 provided in the membrane sheet 2 are in contact with only the pads PD2s arranged along the short sides of the two chips CHP1s, wherein the pads PD1 in contact with the probes 7 are represented by hatched areas. FIG. 19 is a plan view of a main part showing a positional relationship between the pressing member 9 (the pressing pin receiving portion 9C and the membrane sheet pressing portion 9D) and the two chips CHP1s at that time. FIG. 20 and FIG. 21 are sectional views taken along the lines B-B and C-C in FIG. 19, respectively. FIGS. 18 and 19 show a case where the two chips CHP1s are disposed adjacent to each other along the long side. The lines LN1s in FIG. 19 correspond to the positions of the pads PD1s on the plane. In such a case, each membrane sheet pressing portion 9D of the pressing member 9 has the minimum plane size to enable pressing only of the pads PD1s that are disposed along the short sides of the chips CHP1s with which the probes 7 are to be brought into contact. This minimum plane size can be smaller than the plane size of the membrane sheet pressing portion 9D shown in FIG. 11, which is an example of contact with the same two chips CHP1s.

Figure 22:
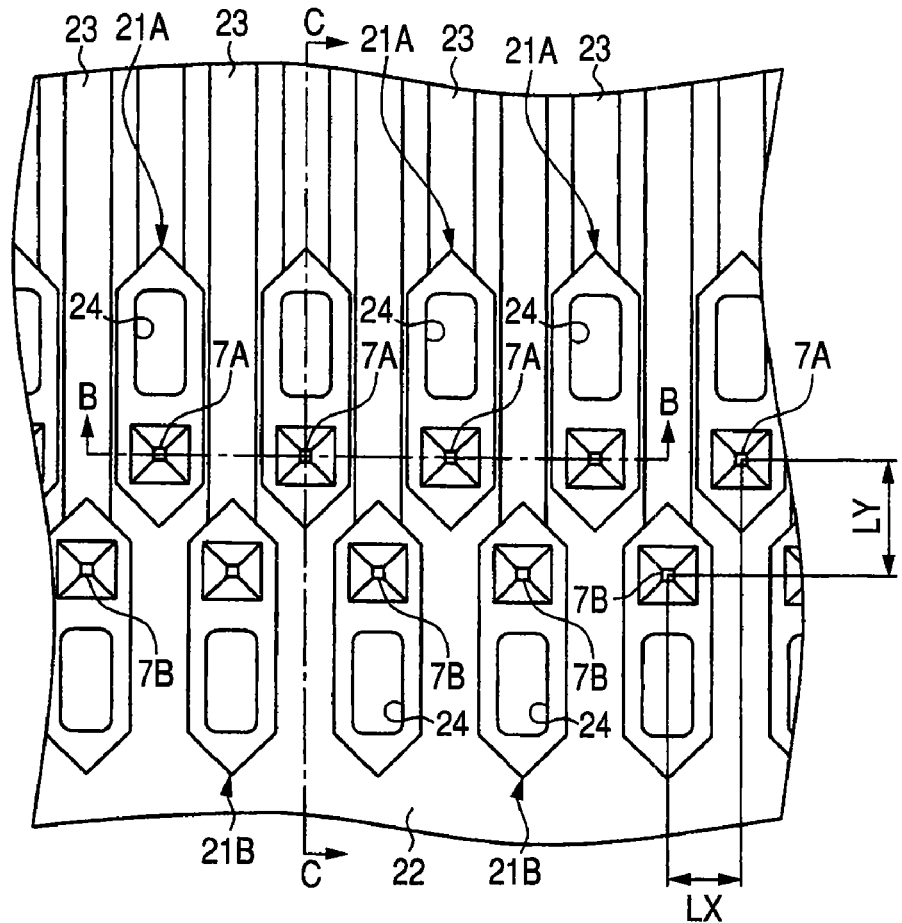
FIG. 22 is a plan view of a main part of a membrane sheet for forming a probe card of another embodiment.
Figure 23:
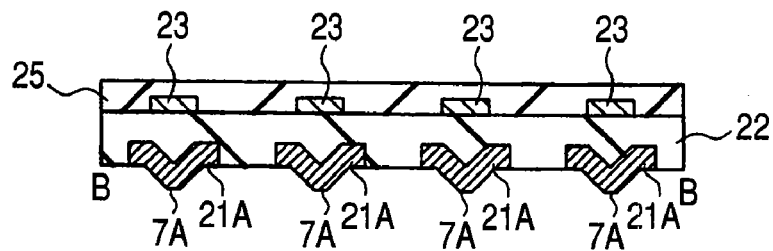
FIG. 23 is a sectional view taken along the line B-B in FIG. 22.
Figure 24:
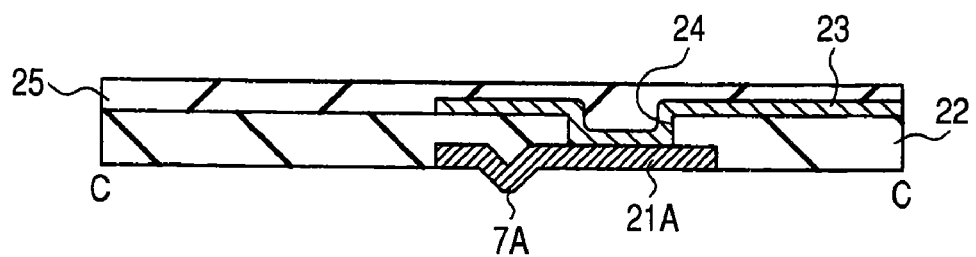
FIG. 24 is a sectional view taken along the line C-C in FIG. 22.

FIG. 22 is a plan view of an enlarged main part of an area with the probes 7 formed on the lower surface of the membrane sheet 2. FIG. 23 is a sectional view of a main part taken along the line B-B in FIG. 22, and FIG. 24 is a sectional view of a main part taken along the line C-C in FIG. 22.

Figure 25:
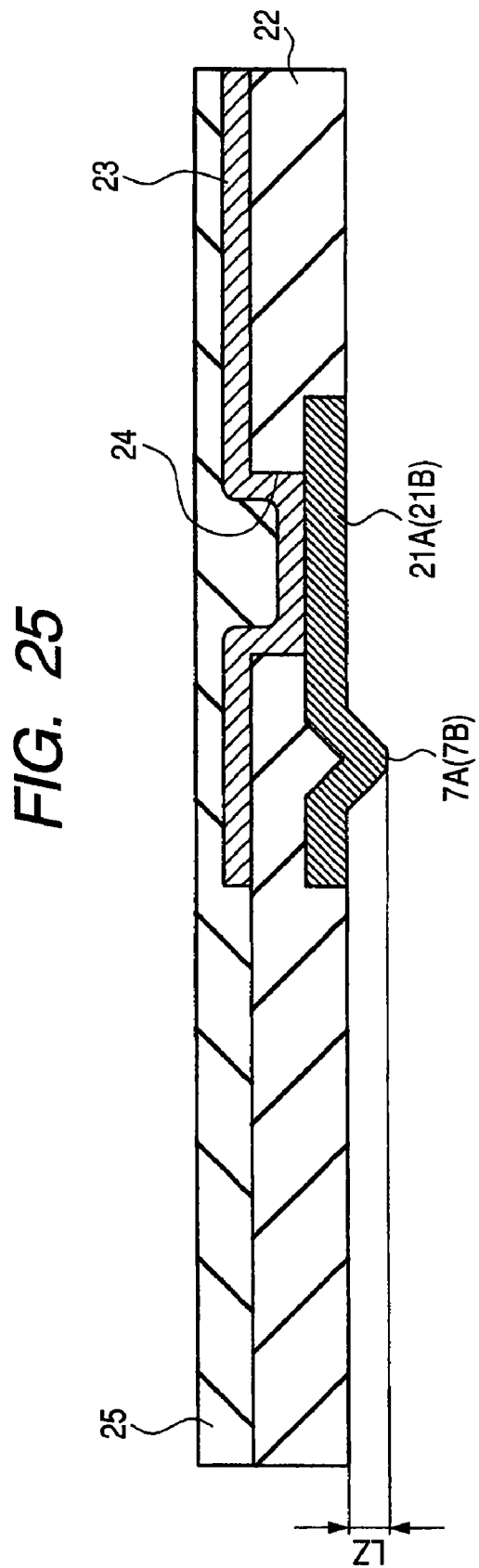
FIG. 25 is an enlarged sectional view of a main part of the membrane sheet for forming the probe card of the embodiment.

The probe 7 is a part of a metal film 21A or 21B which is patterned in the membrane sheet 2 in a plane hexagonal shape, the part being protruding in a four-sided pyramid shape or in a four-sided pyramid trapezoidal shape from the lower surface of the membrane sheet 2 of the metal film 21A or 21B. The probes 7 are arranged in alignment with the pads PD1 and PD2 formed on the chip CHP1 on the main surface of the membrane sheet 2. FIG. 22 shows an arrangement of the probes 7 corresponding to the pads PD1s. Among these probes 7, the probes 7A correspond to the pads PD1s arranged in a row relatively near the outer periphery of the chip CHP1 (hereinafter referred to as a "first row") among the pads PD1s arranged in two rows. The probes 7B correspond to the pads PD1s arranged in a row relatively far away from the outer periphery of the chip CHP1 (hereinafter referred to as a "second row") among the pads PD1s arranged in two rows. The distance between the probe 7A and the probe 7B which are nearest to each other is defined by a distance LX in a left-right direction on the paper representing FIG. 22, and a distance LY in an upper-lower direction. The distance LX is half of the pitch LP between the pads PD1s disposed adjacent to each other, as mentioned above, for example, about 20 µm. In this embodiment, the distance LY is about 45 µm. As shown in FIG. 25, the height LZ (needle height) from the surface of a polyimide film 22 to the tips of the probes 7A, 7B is equal to or less than 50 µm (at most 90 µm or less), and further preferably 30 µm or less.

The metal films 21A, 21B each are formed of a lamination of, for example, a rhodium film, and a nickel film from the lower layer in this order. A polyimide film 22 is formed over the metal films 21A, 21B, and wirings (second wirings) 23 adapted to be electrically coupled to each metal film 21 is formed over the polyimide film 22. The wirings 23 are in contact with the metal films 21A, 21B at the bottoms of through holes 24 formed in the polyimide film 22. A polyimide film 25 is formed over the polyimide film 22 and the wirings 23.

As mentioned above, some parts of the metal films 21A and 21B constitute the probes 7A and 7B formed in the four-sided pyramid shape or four-sided pyramid trapezoidal shape. The through holes 24 reaching the metal films 21A and 21B are formed in the polyimide film 22. Thus, when a plane pattern of the through hole 24 and the metal film 21A with the probe 7A formed thereon is disposed in the same direction as that of a plane pattern of the through hole 24 and the metal film 21B with the probe 7B formed thereon, the adjacent metal films 21A and 21B may be brought into contact with each other, which cannot obtain independent input and output from the probes 7A and 7B. In this embodiment, as shown in FIG. 22, the plane pattern of the through hole 24 and the metal film 21B with the probe 7B formed thereon is one obtained by rotating by 180 degrees the plane pattern of the through hole 24 and the metal film 21A with the probe 7A formed thereon. Thus, a wide area of the metal film 21A with the probe 7A and the through hole 24 disposed on the plane, and a wide area of the metal film 21B with the probe 7B and the through hole 24 disposed on the plane are not located in a line in the left-right direction on the paper surface, so that tapered areas of the metal films 21A and 21B on the plane are arranged in the line in the left-right direction on the paper surface. As a result, this can prevent the contact between the adjacent metal films 21A and 21B. Even with the narrow pitch pads PD1s, the probes 7a and 7B can be arranged in alignment with the respective pads.

Figure 26:
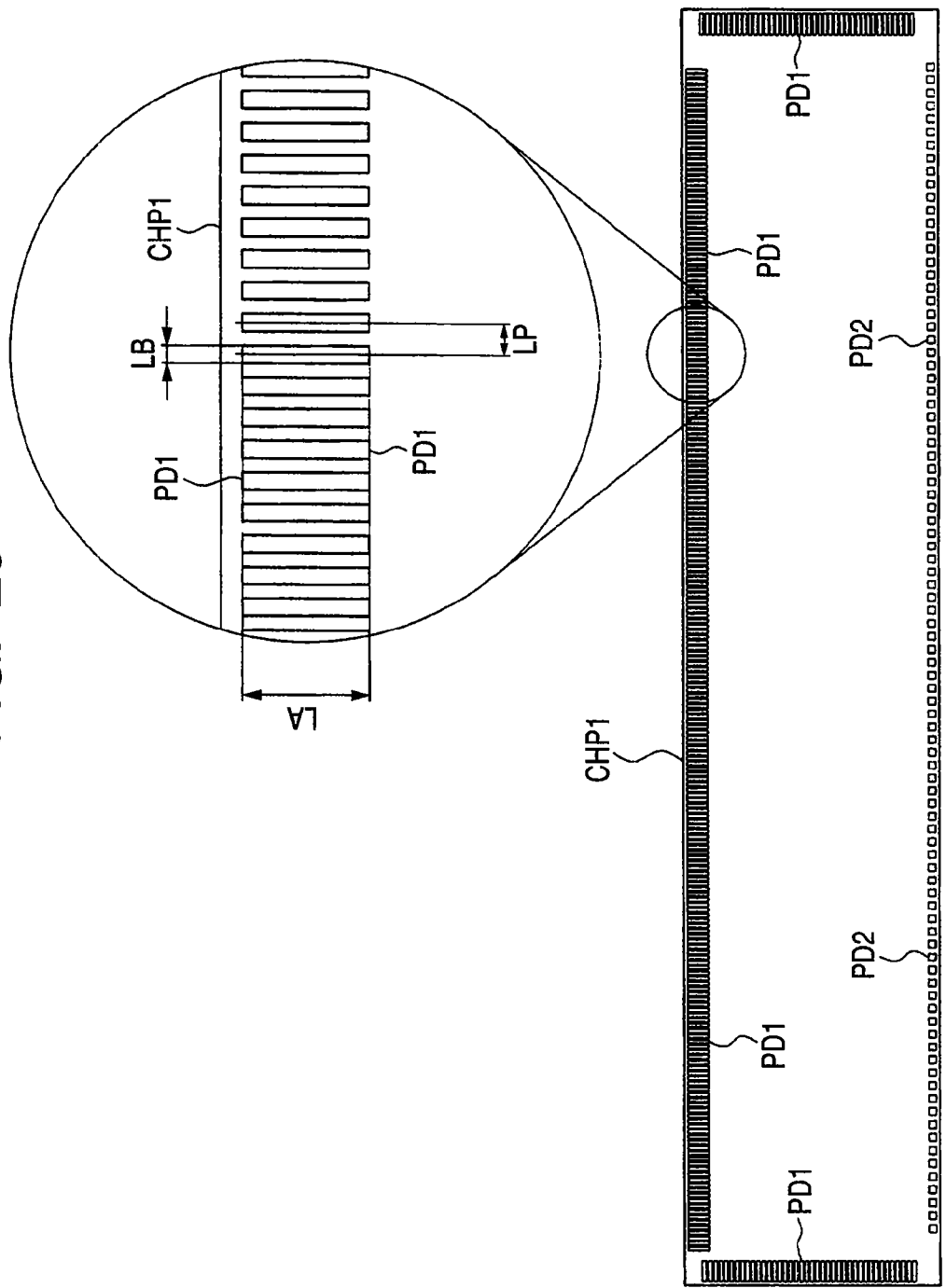
FIG. 26 is a plan view of a semiconductor chip of interest to be subjected to the probe inspection using a probe card of another embodiment.
Figure 27:
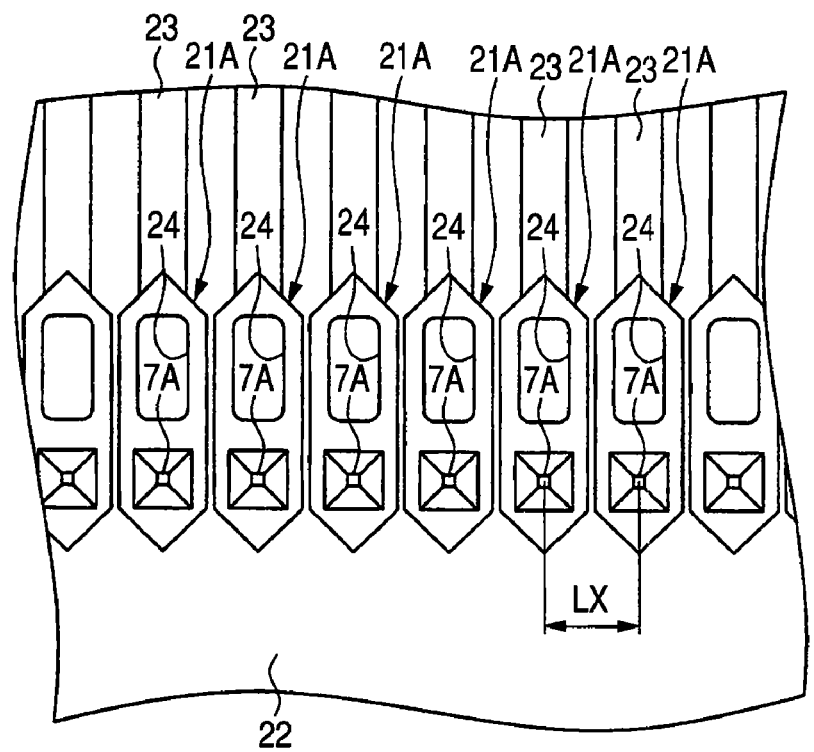
FIG. 27 is a plan view of a main part of the membrane sheet for forming the probe card of the embodiment.
Figure 28:
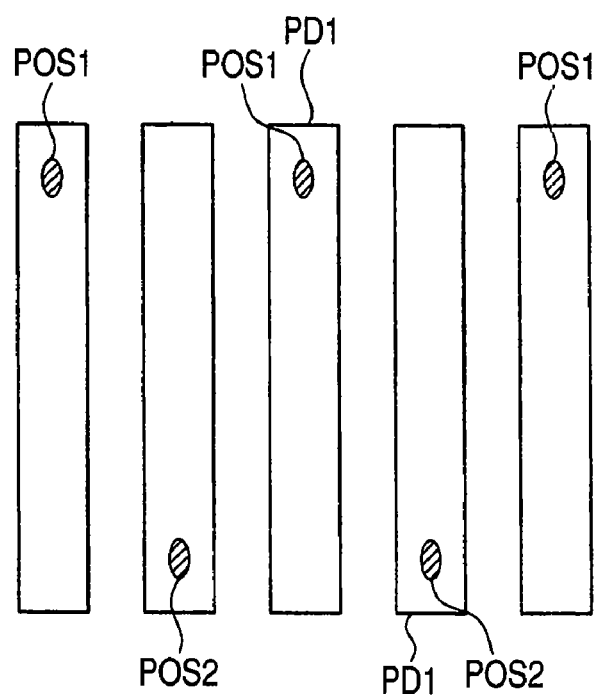
FIG. 28 is a plan view of a main part showing contact positions of the probes on bump electrodes provided in the semiconductor chip of interest to be subjected to the probe inspection using the probe card of the embodiment.

In this embodiment, the arrangement of the pads PD1s in two rows has been described using FIG. 2, but a chip including pads arranged in one row or line may be employed as shown in FIG. 26. In such a chip, the membrane sheet 2 in which wide areas of the metal film 21A are arranged in a line in the left-right direction on the paper surface can be used to handle the chip, as shown in FIG. 27. For example, in this way, the pads PD1s are arranged in one row, the length LA of the long side extending in the direction intersecting (perpendicular to) the outer periphery of the chip CHP1 is about 140 µm, the length LB of the short side extending along the outer periphery of the chip CHP is about 19 µm, the pitch LP between the adjacent pads PD1s is about 34 µm, and a distance between the adjacent pads PD1 is about 15 µm. In this case, the length of the long side of this pad is about two times as long as that of the pad PD1 as shown in FIG. 2, and the center position of the pad PD1 in the direction of the short side can be in alignment with the center position of the pad PD1 as shown in FIG. 2. Thus, the membrane sheet 2 as explained using FIGS. 22 to 24 can be used, so that the probes 7A and 7B can be in contact with the respective pads PD1s in the positions POS1 and POS2 shown in FIG. 28.

Figure 29:
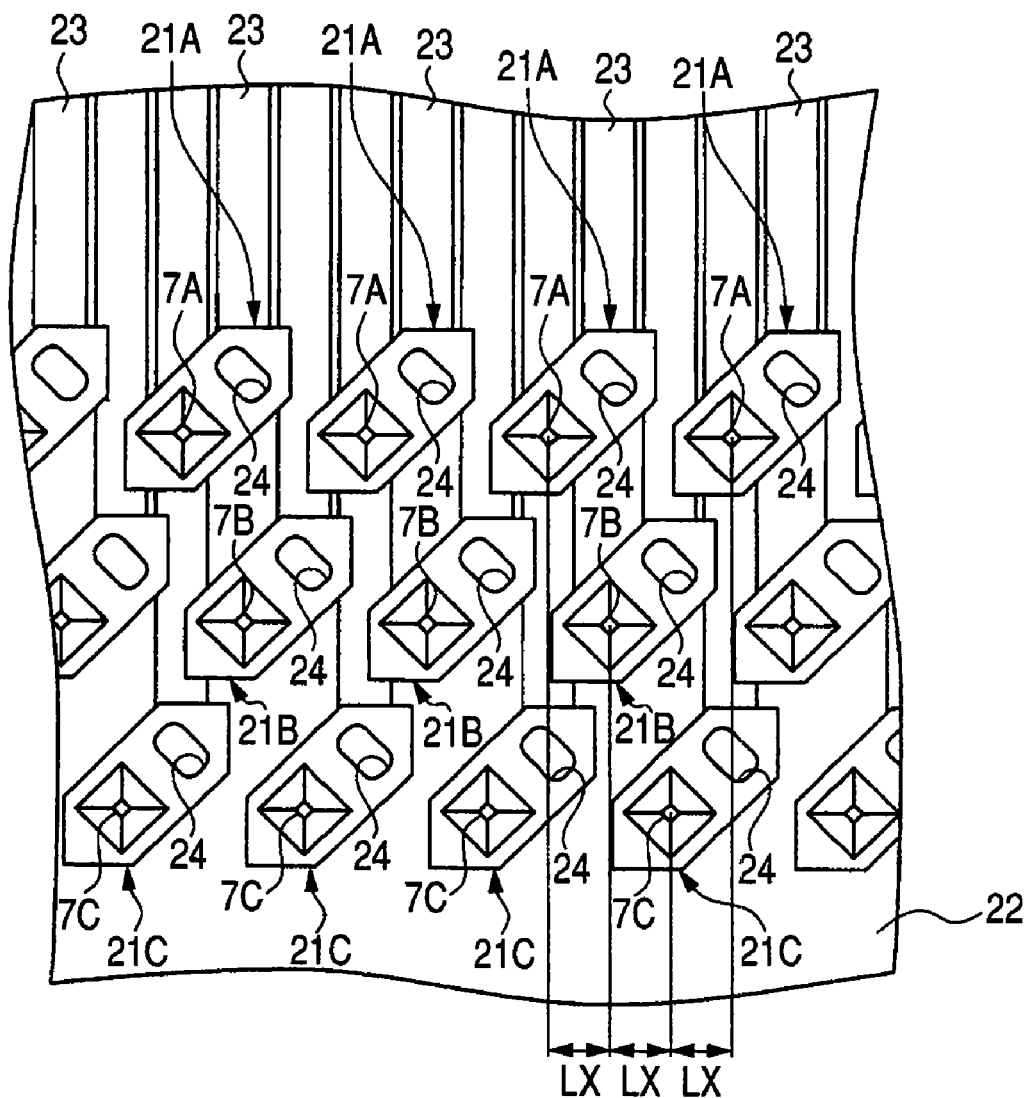
FIG. 29 is a plan view of a main part of a membrane sheet for forming a probe card of another embodiment.
Figure 30:
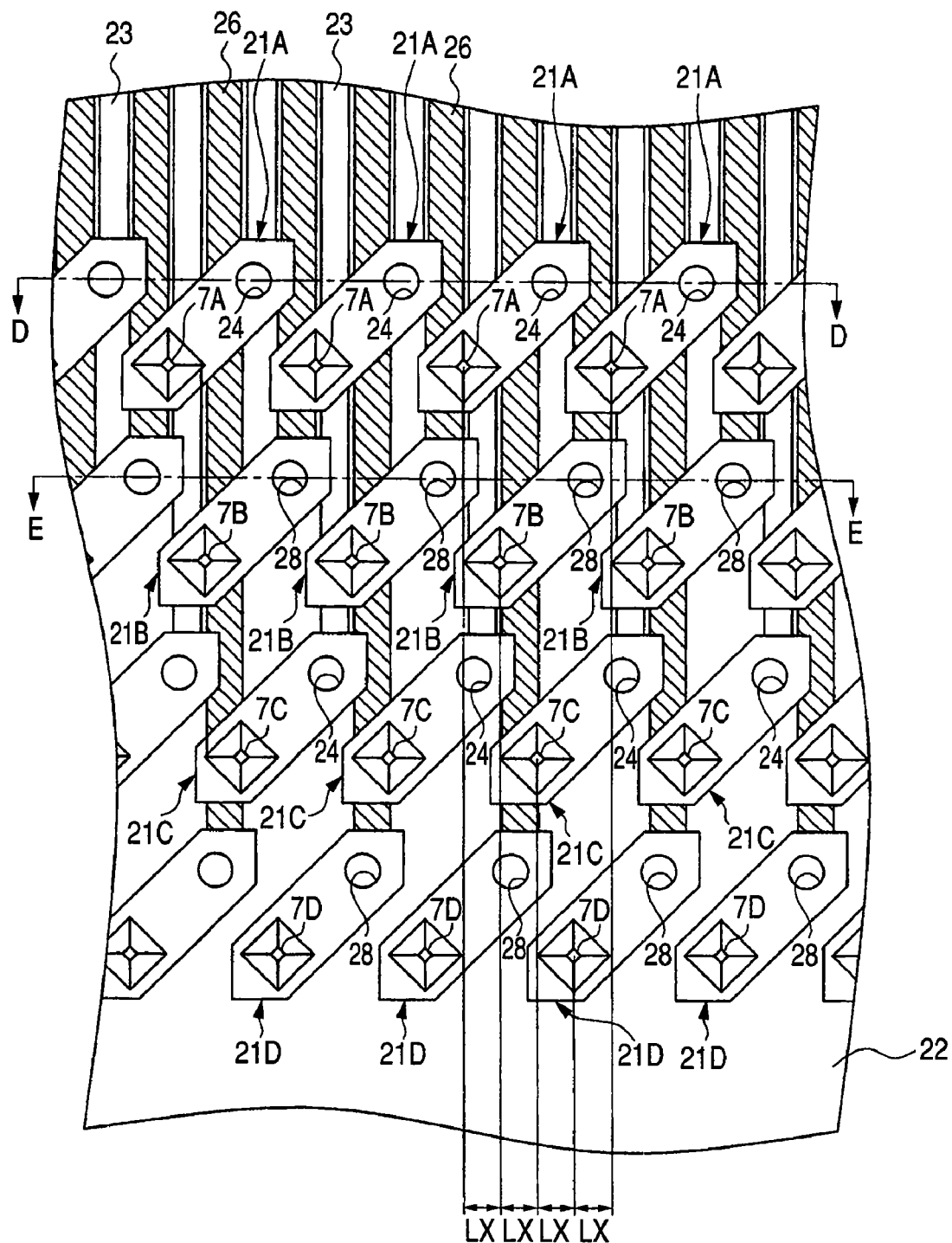
FIG. 30 is a plan view of a main part of a membrane sheet for forming a probe card of another embodiment.

When the number of the pads PD1s is much larger, these pads PD1s may be arranged in three rows. FIG. 29 is a plan view of a main part of the membrane sheet 2 corresponding to the pads PD1s arranged in three rows. FIG. 30 is a plan view of a main part of the membrane sheet 2 corresponding to the pads PD1s arranged in four rows. As the number of rows of the arranged pads PD1 is increased with the sizes of the chips CHP1s being the same, the distance LX as explained above with reference to FIG. 2 further becomes narrower, and thus the metal films including the metal films 21A and 21B may be in contact with each other. Thus, as shown in FIGS. 29 and 30, the metal films 21A, 21B, 21C, and 21D are formed, for example, by rotating by 45 degrees the plane pattern of the metal film 21A shown in FIG. 22, thereby preventing the contact among the metal films 21A, 21B, 21C, and 21D. An example in which the plane pattern of the metal film 21A shown in FIG. 22 is rotated by 45 degrees has been explained above, but the invention is not limited to 45 degrees. Any other appropriate rotation angle may be adopted so as to enable prevention of the contact among the metal films 21A, 21B, 21C, and 21D. The metal film 21C has probes 7c formed corresponding to the pads PD1s disposed inside the chip CHP1 with respect to the pads PD1s corresponding to the probes 7B. The metal film 21D has probes 7D formed corresponding to the pads PD1s disposed inside the chip CHP1 with respect to the pads PD1s corresponding to the probes 7C.

Figure 31:
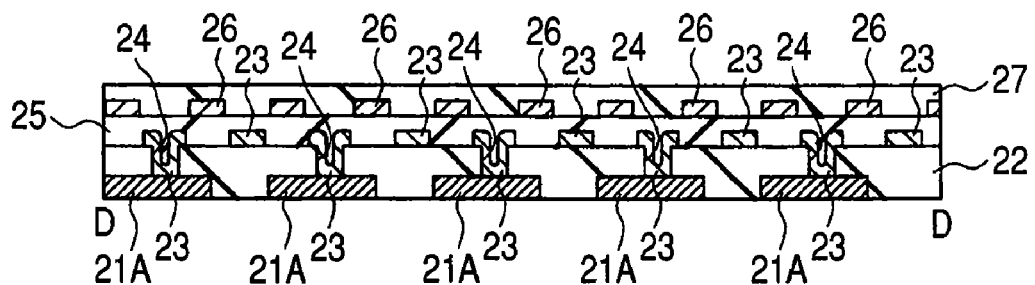
FIG. 31 is a sectional view taken along line D-D in FIG. 30.
Figure 32:
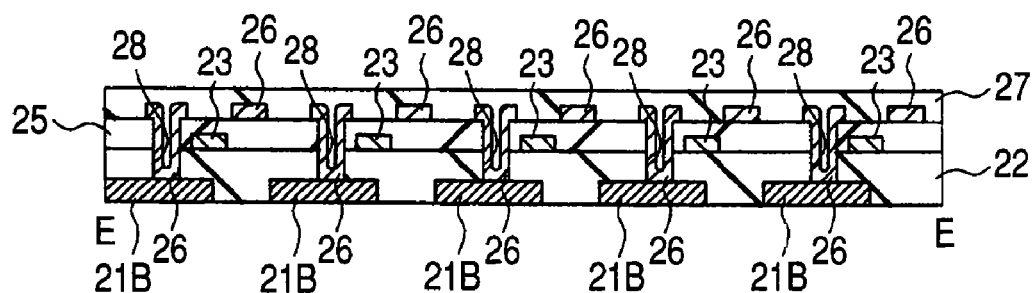
FIG. 32 is a sectional view taken along line E-E in FIG. 30.

FIG. 31 is a sectional view of a main part taken along the line D-D in FIG. 30, and FIG. 32 is a sectional view of a main part taken along the line E-E in FIG. 30. When the metal films 21A to 21D including the probes 7A to 7D corresponding to the pads PD1s in four rows are arranged as shown in FIG. 30, it is difficult to form all wirings electrically coupled to the respective metal films 21A to 21D from the upper layer by the same wiring layer. This is because the metal films 21A to 21D may be in contact with each other due to the narrow distance LX, and the wirings electrically coupled to the metal films 21A to 21D may come into contact with each other.

In an example of this embodiment, these wirings can be formed of two-layered wiring layers (wirings 23 and 26) as shown in FIGS. 31 and 32. A polyimide film 27 is formed over the wiring 26 and the polyimide film 25. The wirings 23 serving as a relatively lower layer are in contact with the metal films 21A, 21C through the bottoms of the through holes 24 formed in the polyimide film 22, and the wirings 26 serving as a relatively upper layer are in contact with the metal films 21B, 21C through the bottoms of the through holes 28 formed in the polyimide films 22, 25. Thus, the large distance between the adjacent wirings 23 or 26 can be assured in the same wiring layer, thereby preventing the contact between the adjacent wirings 23 or 26. When the number of rows of the pads PD1s is five or more and the number of probes corresponding thereto is increased to decrease the distance LX, multi-layered wiring layers may be formed with the distance between wirings becoming wider.

Now, the structure of the membrane sheet 2 of this embodiment will be described together with a manufacturing procedure thereof using FIGS. 33 to 39. FIGS. 33 to 39 are sectional views of main parts of manufacturing steps of the membrane sheet including the probes 7A and 7B corresponding to the pads PD1s in two rows (see FIG. 2) as described using FIGS. 22 to 24.

Figure 33:
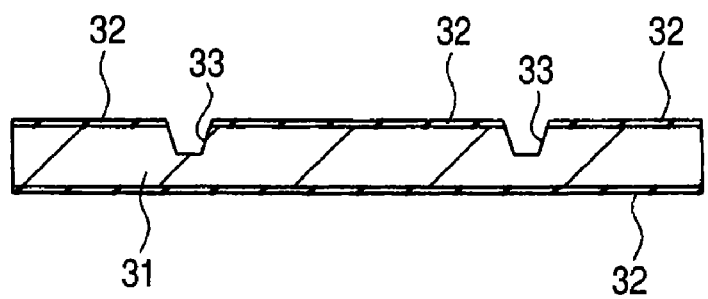
FIG. 33 is a sectional view of a main part for explaining a manufacturing step of the membrane sheet for forming the probe card of the embodiment.

First, as shown in FIG. 33, a wafer 31 made of silicon and having a thickness of about 0.2 to 0.6 mm is prepared, and then a silicon oxide film 32 is formed in a thickness of about 0.5 µm on each side of the wafer 31 by thermal oxidation. Subsequently, the silicon oxide film 32 on the main surface side of the wafer 31 is etched using a photoresist film as a mask, and an opening reaching the wafer 31 is formed in the silicon oxide film 32 on the main surface side of the wafer 31. Then, the wafer 31 is anisotropically etched in a strong alkaline aqueous solution (for example, in a potassium hydrate aqueous solution) using the remaining silicon oxide film 32 as the mask to form on the main surface of the wafer 31, a hole 33 having a four-sided pyramid shape or a four-sided pyramid trapezoidal shape and surround by the (111) surface.

Figure 34:
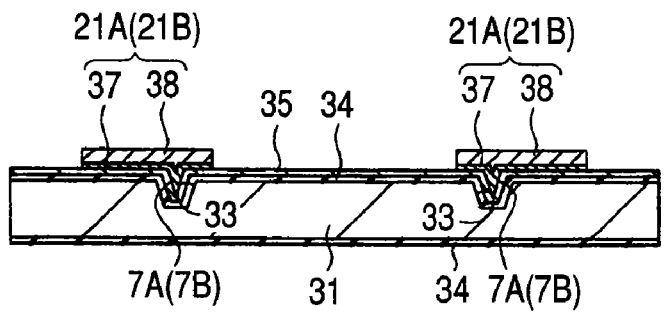
FIG. 34 is a sectional view of a main part of a manufacturing step of the membrane sheet following the step shown in FIG. 33.

Then, as shown in FIG. 34, the silicon oxide film 32 used as the mask in the formation of the holes 33 is removed by wet etching in a mixed liquid containing fluorinated acid and ammonium fluoride. Subsequently, the wafer 31 is subjected to the thermal oxidation process to form a silicon oxide film 34 having a thickness of about 0.5 µm over the entire surface of the wafer 31 including the inside of the holes 33. Then, an electrically conductive film 35 is formed on the main surface of the wafer 31 including the inside of the holes 33. The electrically conductive film 35 can be formed by sequentially depositing a chrome film having a thickness of about 0.1 µm and a copper film having a thickness of about 1 µm by a sputtering or vapor deposition process. Thereafter, a photoresist film is formed on the electrically conductive film 35, and then removed by a photolithography technique at the areas thereof on which the metal films 21A and 21B are to be formed in the following step (see FIGS. 22 to 24) to form an opening.

Then, an electrically conductive film 37 and an electrically conductive film 38 which have high hardness are sequentially deposited on the electrically conductive film 35 which appears at the bottom of the opening of the photoresist film by electrolytic plating using the electrically conductive film 35 as electrodes. In an example of this embodiment, the electrically conductive film 37 is a rhodium film, and the electrically conductive film 38 is a nickel film. In the above steps, the above-mentioned metal films 21A and 21B can be made from the electrically conductive films 37, 38. The electrically conductive films 37 and 38 inside the holes 33 serve as the probes 7A and 7B as mentioned above. Note that the electrically conductive film 35 is removed in the following step, and this step thereof will be described later.

In the metal films 21A and 21B, in the following step of forming the above probes 7A and 7B, the electrically conductive film 37 made of the rhodium film appears as the surface, and comes into direct contact with the pads PD1s. For this reason, materials having high toughness and excellent abrasive resistance may be preferably selected for use in the electrically conductive film 37. Since the electrically conductive film 37 is directly in contact with the pads PD1s, when chippings of the pads PD1s cut by the probes 7A and 7B touch the electrically conductive film 37, a cleaning step for removing these chippings may be needed, and thus the probe inspection step may take more time. For this reason, materials that are difficult to be attached to the material forming the pad PD1 are preferably selected for use in the electrically conductive film 37. In this embodiment, the rhodium film satisfying these conditions is selected as the electrically conductive film 37. Accordingly, the cleaning step as described above can be omitted.

Figure 35:
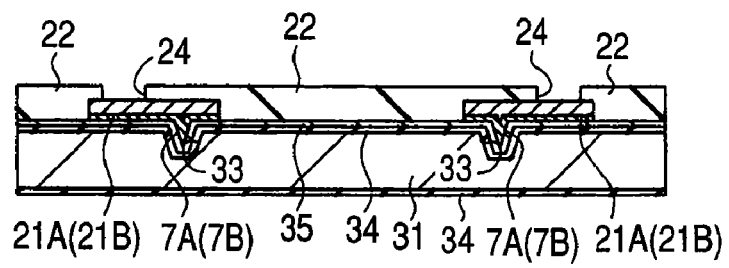
FIG. 35 is a sectional view of a main part of a manufacturing step of the membrane sheet following the step shown in FIG. 34.

Then, after removing the photoresist film used in formation of the metal films 21A and 21B (electrically conductive films 37 and 38), as shown in FIG. 35, the polyimide film 22 (see FIGS. 23 and 24) is formed to cover the metal films 21A and 21B and the electrically conductive film 35. Subsequently, the above-mentioned through holes 24 reaching the metal films 21A and 21B are formed in the polyimide film 22. This through hole 24 can be formed by a drilling process using a laser, or by dry etching using an aluminum film as a mask.

Figure 36:
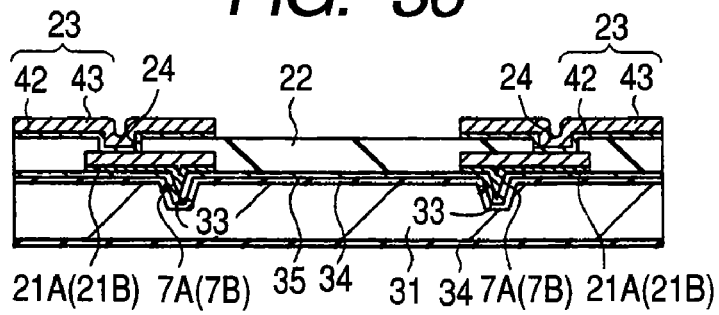
FIG. 36 is a sectional view of a main part of a manufacturing step of the membrane sheet following the step shown in FIG. 35.

Then, as shown in FIG. 36, an electrically conductive film 42 is formed on the polyimide film 22 including the insides of the through holes 24. The electrically conductive film 42 can be formed by sequentially depositing a chrome film having a thickness of about 0.1 µm and a copper film having a thickness of about 1 µm by a sputtering or vapor deposition process. Subsequently, a photoresist film is formed on the electrically conductive film 42, and therefore the photoresist film is patterned by the photolithography technology to form openings reaching the electrically conductive film 42 in the photoresist film. Then, an electrically conductive film 43 is formed on the electrically conductive film 42 in the openings by plating. In an example of this embodiment, the electrically conductive film 43 can be either a copper film, or a lamination formed by sequentially depositing a copper film and a nickel film from the lower layer.

Figure 37:
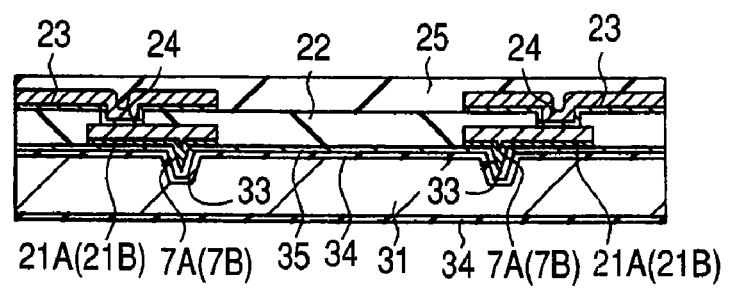
FIG. 37 is a sectional view of a main part of a manufacturing step of the membrane sheet following the step shown in FIG. 36.

Then, after removing the photoresist film, the electrically conductive film 42 is etched using the electrically conductive film 43 as the mask to form the wirings 23 consisting of the electrically conductive films 42 and 43. The wirings 23 can be electrically coupled to the metal films 21A and 21B at the bottoms of the through holes 24. Then, as shown in FIG. 37, the above-mentioned polyimide film 25 is formed over the main surface of the wafer 31 as shown in FIG. 37.

Figure 38:
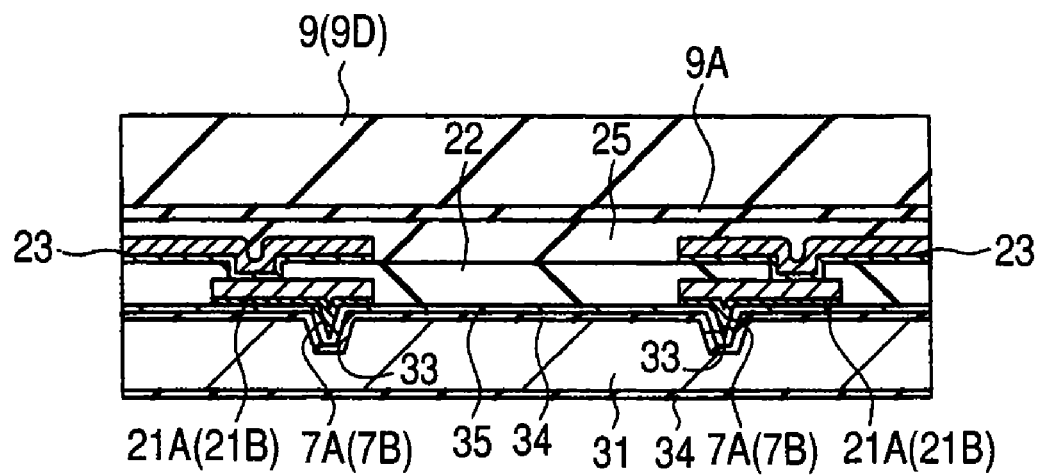
FIG. 38 is a sectional view of a main part of a manufacturing step of the membrane sheet following the step shown in FIG. 37.

As shown in FIG. 38, the above-mentioned pressing member 9 (membrane sheet pressing portion 9D) is attached to the polyimide film 25, while being aligned using an epoxy adhesive material 9A with reference to FIGS. 7 to 21.

Figure 39:
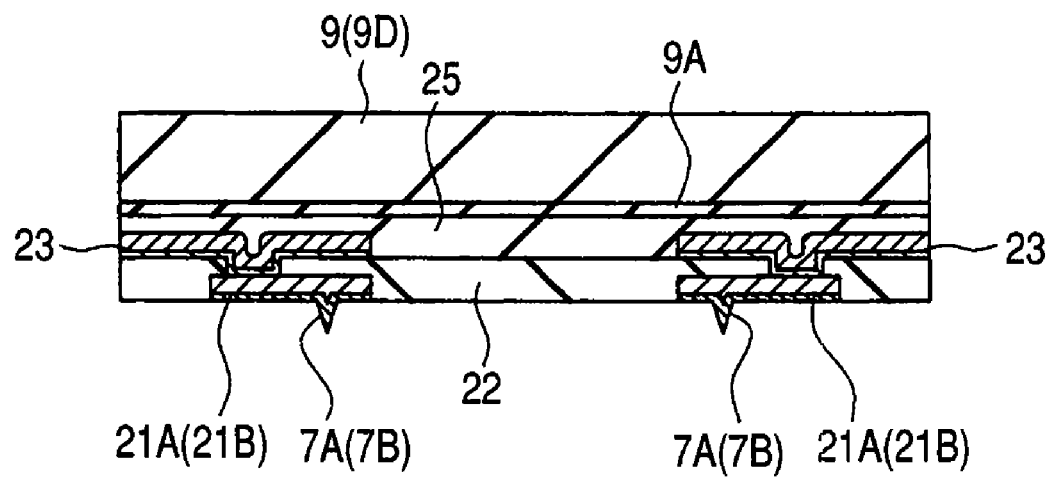
FIG. 39 is a sectional view of a main part of a manufacturing step of the membrane sheet following the step shown in FIG. 38.

Then, as shown in FIG. 39, the silicon oxide film 34 on the back side of the wafer 31 is removed by etching using, for example, a mixed liquid containing fluorinated acid and ammonium fluoride. Subsequently, the wafer 31 serving as a mold material for forming the membrane sheet 2 is removed by etching using a strong alkaline aqueous solution (for example, potassium hydrate aqueous solution) to manufacture the membrane sheet 2 of this embodiment. Then, the silicon oxide film 34 and the electrically conductive film 35 are removed by etching sequentially. At this time, the silicon oxide film 34 is etched using a mixed liquid containing fluorinated acid and ammonium fluoride. The chrome film included in the electrically conductive film 35 is etched using a potassium permanganate aqueous solution. The copper film included in the electrically conductive film 35 is etched using an alkaline copper etching solution. Up to this step, the rhodium film which is the electrically conductive film 37 forming the probes 7A and 7B (see FIG. 34) appears on the surfaces of the probes 7A and 7B. As mentioned above, in the probes 7A and 7B with the rhodium film formed thereon, the material for the pad PD1, for example, Au or the like, which is brought into contact with the probes 7A and 7B, is difficult to be attached to the probes. Such a material has a higher hardness than that of Ni, and is difficult to be oxidized, so that the contact resistance of the probes can be stabilized.

While the invention proposed by the inventors has been described based on specific embodiments thereof, it is to be understood that the invention is not limited thereto in any way and that various modifications can be made without departing from the scope of the invention.

The method of manufacturing a semiconductor integrated circuit device according to the invention can be widely applied to, for example, a probe inspection step in the manufacturing procedure of the semiconductor integrated circuit device.

What is claimed is:

1. A method of manufacturing a semiconductor integrated circuit device, comprising the steps of:
   (a) preparing a semiconductor wafer, the wafer being partitioned into a plurality of chip areas, each of which has a semiconductor integrated circuit formed thereover, the wafer having a plurality of first electrodes formed over a main surface thereof and electrically coupled to the semiconductor integrated circuits;
   (b) preparing a first card, the card including: a first wiring substrate having a plurality of first wirings formed thereover; a first sheet having a plurality of contact terminals to be electrically coupled to the first electrodes and a plurality of second wirings electrically coupled to the contact terminals, the second wirings being electrically coupled to the first wirings, the first sheet being held by the first wiring substrate with tips of the contact terminals being opposed to the main surface of the wafer; and a pressing mechanism for pressing a first area of the first sheet with the contact terminals formed thereover, from a back side of the sheet; and
   (c) performing electric inspection of the semiconductor integrated circuit by bringing the tips of the contact terminals into contact with the first electrodes,
   wherein the pressing mechanism includes a first pressing portion and a second pressing portion located under the first pressing portion and opposed to the first sheet, the second pressing portion having a relatively smaller plane size than that of the first pressing portion, and
   wherein the pressing mechanism is in contact with the first sheet at the second pressing portion.

2. The method according to claim 1, wherein the second pressing portion extends along an arrangement of the contact terminals on a plane.

3. The method according to claim 1, wherein the second pressing portion has a plane area that is equal to or less than half of that of the first pressing portion.

4. A method of manufacturing a semiconductor integrated circuit device, comprising the steps of:
   (a) preparing a semiconductor wafer, the wafer being partitioned into a plurality of chip areas, each of which has a semiconductor integrated circuit formed thereover, and the wafer having a plurality of first electrodes formed over a main surface thereof and electrically coupled to the semiconductor integrated circuits;
   (b) preparing a first card, the card including: a first wiring substrate having a plurality of first wirings formed thereover; a first sheet having a plurality of contact terminals to be electrically coupled to the first electrodes and a plurality of second wirings electrically coupled to the contact terminals, the second wirings being electrically coupled to the first wirings, the first sheet being held by the first wiring substrate with tips of the contact terminals being opposed to the main surface of the wafer; a pressing mechanism attached to a back side of a first area of the first sheet with the contact terminals formed thereover for pressing the first area from the back side; and a pressurization mechanism for pressurizing the pressing mechanism in a direction toward the first sheet; and
   (c) performing electric inspection of the semiconductor integrated circuit by bringing the tips of the contact terminals into contact with the first electrodes,
   wherein the pressing mechanism has a hole provided in a center of a second surface thereof opposite to a first surface to which the first sheet is attached,
   wherein a tip of the pressurization mechanism is in contact with the pressing mechanism through the hole, and
   wherein the pressurization mechanism is fixed to the first card in alignment with the hole in a horizontal direction with respect to the second surface.

5. The method according to claim 4,
   wherein the pressurization mechanism is fixed to the first card by one or more screws, and
   wherein one or more screw holes provided in the pressurization mechanism and through which the one or more screws penetrate are formed to have a larger diameter than that of the screw.

6. The method according to claim 5, wherein the diameter of the one or more screw holes provided in the pressurization mechanism has a size for correcting a deviation of an attached position of the pressing mechanism to the back side of the first sheet, and for being capable of screwing the one or more screws with the tip of the pressurization mechanism being aligned with the hole.

7. The method according to claim 4,
   wherein the pressing mechanism includes a first pressing portion and a second pressing portion located under the first pressing portion and opposed to the first sheet, the second pressing portion having a relatively smaller plane size than that of the first pressing portion, and
   wherein the pressing mechanism is in contact with the first sheet at the second pressing portion.

8. The method according to claim 7, wherein the second pressing portion extends along an arrangement of the contact terminals on a plane.

9. The method according to claim 7, wherein the second pressing portion has a plane area that is equal to or less than half of that of the first pressing portion.

* * * * *